US008741177B2

(12) United States Patent
Pickett et al.

(10) Patent No.: US 8,741,177 B2
(45) Date of Patent: Jun. 3, 2014

(54) METHOD FOR PRODUCING AQUEOUS COMPATIBLE NANOPARTICLES

(75) Inventors: Nigel Pickett, East Croydon (GB); Mark C. McCairn, Newent (GB)

(73) Assignee: Nanoco Technologies Ltd., Manchester (GB)

( * ) Notice: Subject to any disclaimer, the term of this patent is extended or adjusted under 35 U.S.C. 154(b) by 1081 days.

(21) Appl. No.: 12/505,931

(22) Filed: Jul. 20, 2009

(65) Prior Publication Data

US 2010/0059721 A1 Mar. 11, 2010

Related U.S. Application Data

(60) Provisional application No. 61/082,335, filed on Jul. 21, 2008.

(30) Foreign Application Priority Data

Jul. 19, 2008 (GB) .................................. 0813273.0

(51) Int. Cl.
C09K 11/08 (2006.01)
C09K 11/56 (2006.01)

(52) U.S. Cl.
USPC .............. 252/301.4 S; 252/301.6 S; 977/774; 977/813; 977/895; 977/896

(58) Field of Classification Search
USPC ....... 252/301.4 R, 301.4 S, 301.6 S; 428/403; 977/774, 813, 895, 896
See application file for complete search history.

(56) References Cited

U.S. PATENT DOCUMENTS

| | | | |
|---|---|---|---|
| 2,769,838 A | 11/1956 | Matter et al. |
| 3,524,771 A | 8/1970 | Green |
| 4,609,689 A | 9/1986 | Schwartz et al. |
| 5,594,058 A | 1/1997 | Olsen et al. |
| 6,114,038 A | 9/2000 | Castro et al. |
| 6,207,229 B1 | 3/2001 | Bawendi et al. |
| 6,221,602 B1 | 4/2001 | Barbera-Guillem et al. |
| 6,261,779 B1 | 7/2001 | Barbera-Guillem et al. |
| 6,322,901 B1 | 11/2001 | Bawendi et al. |
| 6,326,144 B1 | 12/2001 | Bawendi et al. |
| 6,333,110 B1 | 12/2001 | Barbera-Guillem |
| 6,379,635 B2 | 4/2002 | O'Brien et al. |
| 6,423,551 B1 | 7/2002 | Weiss et al. |
| 6,426,513 B1 | 7/2002 | Bawendi et al. |
| 6,607,829 B1 | 8/2003 | Bawendi et al. |
| 6,660,379 B1 | 12/2003 | Lakowicz et al. |
| 6,699,723 B1 | 3/2004 | Weiss et al. |
| 6,727,065 B2 | 4/2004 | Weiss et al. |
| 6,815,064 B2 | 11/2004 | Treadway et al. |
| 6,855,551 B2 | 2/2005 | Bawendi et al. |
| 6,914,264 B2 | 7/2005 | Chen et al. |
| 6,992,202 B1 | 1/2006 | Banger et al. |
| 7,041,362 B2 | 5/2006 | Barbera-Guillem |
| 7,041,371 B2 | 5/2006 | Ogura |
| 7,101,718 B2 | 9/2006 | Weiss et al. |
| 7,151,047 B2 | 12/2006 | Chan et al. |
| 7,235,361 B2 | 6/2007 | Bawendi et al. |
| 7,264,527 B2 | 9/2007 | Bawendi et al. |
| 7,273,509 B1 | 9/2007 | Keller et al. |
| 7,396,560 B2 | 7/2008 | Nakanishi et al. |
| 7,544,725 B2 | 6/2009 | Pickett et al. |
| 7,588,828 B2 | 9/2009 | Mushtaq et al. |
| 7,674,844 B2 | 3/2010 | Pickett et al. |
| 7,803,423 B2 | 9/2010 | O'Brien et al. |
| 7,867,556 B2 | 1/2011 | Pickett |
| 7,867,557 B2 | 1/2011 | Pickett et al. |
| 2003/0017264 A1 | 1/2003 | Treadway et al. |
| 2003/0106488 A1 | 6/2003 | Huang et al. |
| 2003/0148024 A1 | 8/2003 | Kodas et al. |
| 2004/0007169 A1 | 1/2004 | Ohtsu et al. |
| 2004/0036130 A1 | 2/2004 | Lee et al. |
| 2004/0110002 A1 | 6/2004 | Kim et al. |
| 2004/0110347 A1 | 6/2004 | Yamashita |
| 2004/0178390 A1 | 9/2004 | Whiteford et al. |
| 2004/0250745 A1 | 12/2004 | Ogura et al. |
| 2005/0098204 A1 | 5/2005 | Roscheisen et al. |
| 2005/0129947 A1 | 6/2005 | Peng et al. |
| 2005/0145853 A1 | 7/2005 | Sato et al. |
| 2006/0019098 A1 | 1/2006 | Chan et al. |
| 2006/0057382 A1 | 3/2006 | Treadway et al. |
| 2006/0061017 A1 | 3/2006 | Strouse et al. |

(Continued)

FOREIGN PATENT DOCUMENTS

| | | |
|---|---|---|
| CN | 1394599 | 2/2003 |
| EP | 1176646 | 1/2002 |

(Continued)

OTHER PUBLICATIONS

International Search Report dated Feb. 17, 2010, for International Application No. PCT/GB2009/001777 (Publication No. WO2010/010329 Publication Date: Jan. 28, 2010).
Clarke, et al. "Effect of Ligand Density on the Spectral, Physical and Biological Characteristics of CdSe/ZnS QUantum Dots," Bioconjugate Chemistry, vol. 19, Jan. 18, 2008 pp. 562-568, XP002567175.
Kloepfer, et al. "Photophysical Properties of Biologically Compatible CdSe Quantum Dot Structures," J. Phys. Chem. B, vol. 109, 2005, pp. 9996-10003, XP002567176.
Hwang, et al. "Characterization of ZnSe/ZnS Core Shell Quantum Dots Synthesized at Various Temperature Conditions and the Water Soluble ZnSe/ZnS Quantum Dot," Bull. Korean Chem. Soc., vol. 26, No. 11, 2005, pp. 1776-1782, XP002567177.
Breus, et al. "Quenching of CdSe-ZnS Core-Shell Quantum Dot Luminescence by Water-Soluble Thiolated Ligands," J. Phys. Chem. C, vol. 111, 2007, pp. 18589-18594, XP002567178.
Hyun, et al. "PbS and PbSe QD's and thiol ligands," J. PHys. CHem B, vol. 111, 2007 pp. 5726-5730, XP002567179.

(Continued)

*Primary Examiner* — Mark Kopec
*Assistant Examiner* — Haidung Nguyen
(74) *Attorney, Agent, or Firm* — Wong, Cabello, Lutsch, Rutherford & Brucculeri LLP.

(57) ABSTRACT

A method for producing aqueous compatible semiconductor nanoparticles includes binding pre-modified ligands to nanoparticles without the need for further post-binding modification to render the nanoparticles aqueous compatible. Nanoparticles modified in this way may exhibit enhanced fluorescence and stability compared to aqueous compatible nanoparticles produced by methods requiring post-binding modification processes.

16 Claims, 8 Drawing Sheets

(56) References Cited

U.S. PATENT DOCUMENTS

| | | |
|---|---|---|
| 2006/0068154 A1 | 3/2006 | Parce et al. |
| 2006/0110279 A1 | 5/2006 | Han et al. |
| 2006/0118757 A1 | 6/2006 | Klimov et al. |
| 2006/0130741 A1 | 6/2006 | Peng et al. |
| 2007/0012941 A1 | 1/2007 | Cheon |
| 2007/0034833 A1 | 2/2007 | Parce et al. |
| 2007/0059705 A1 | 3/2007 | Lu et al. |
| 2007/0104865 A1 | 5/2007 | Pickett |
| 2007/0110816 A1 | 5/2007 | Jun et al. |
| 2007/0114520 A1 | 5/2007 | Garditz et al. |
| 2007/0125983 A1 | 6/2007 | Treadway et al. |
| 2007/0131905 A1 | 6/2007 | Sato et al. |
| 2007/0199109 A1 | 8/2007 | Yi et al. |
| 2007/0202333 A1 | 8/2007 | O'Brien et al. |
| 2007/0238126 A1 | 10/2007 | Pickett et al. |
| 2008/0107911 A1 | 5/2008 | Liu et al. |
| 2008/0112877 A1 | 5/2008 | Xiao et al. |
| 2008/0121844 A1 | 5/2008 | Jang et al. |
| 2008/0160306 A1 | 7/2008 | Mushtaq et al. |
| 2008/0190483 A1 | 8/2008 | Carpenter et al. |
| 2008/0220593 A1 | 9/2008 | Pickett et al. |
| 2008/0257201 A1 | 10/2008 | Harris et al. |
| 2008/0264479 A1 | 10/2008 | Harris et al. |
| 2009/0022974 A1 | 1/2009 | Lee et al. |
| 2009/0139574 A1 | 6/2009 | Pickett et al. |
| 2009/0212258 A1 | 8/2009 | McCairn et al. |
| 2009/0263816 A1 | 10/2009 | Pickett et al. |
| 2010/0068522 A1 | 3/2010 | Pickett et al. |
| 2010/0113813 A1 | 5/2010 | Pickett et al. |
| 2010/0123155 A1 | 5/2010 | Pickett et al. |
| 2010/0193767 A1 | 8/2010 | Naasani et al. |
| 2010/0212544 A1 | 8/2010 | Harris et al. |

FOREIGN PATENT DOCUMENTS

| | | | |
|---|---|---|---|
| EP | 1783137 | | 5/2007 |
| EP | 1854792 | | 11/2007 |
| GB | 2429838 A | | 3/2007 |
| JP | 10204124 | | 8/1998 |
| JP | 2005139389 A | | 6/2005 |
| WO | WO-95189106 | | 7/1995 |
| WO | WO-9710175 | | 3/1997 |
| WO | WO-0017642 | | 3/2000 |
| WO | WO 0027365 | * | 5/2000 |
| WO | WO-0204527 | | 1/2002 |
| WO | WO-0224623 | | 3/2002 |
| WO | WO-0229140 | | 4/2002 |
| WO | WO-03099708 | | 12/2003 |
| WO | WO-2004008550 A2 | | 1/2004 |
| WO | WO-2004033366 A1 | | 4/2004 |
| WO | WO-2004065362 A2 | | 8/2004 |
| WO | WO-2004066361 A2 | | 8/2004 |
| WO | WO-2005021150 A2 | | 3/2005 |
| WO | WO 2005093422 A2 | * | 10/2005 |
| WO | WO-2005106082 A1 | | 11/2005 |
| WO | WO-2005123575 A1 | | 12/2005 |
| WO | WO-2006001848 | | 1/2006 |
| WO | WO-2006017125 A2 | | 2/2006 |
| WO | WO-2006075974 A1 | | 7/2006 |
| WO | WO-2006116337 A2 | | 11/2006 |
| WO | WO-2006118543 A1 | | 11/2006 |
| WO | WO-2006134599 A1 | | 12/2006 |
| WO | WO-2007020416 A1 | | 2/2007 |
| WO | WO-2007049052 A2 | | 5/2007 |
| WO | WO-2007060591 A2 | | 5/2007 |
| WO | WO-2007065039 A2 | | 6/2007 |
| WO | WO-2007098378 | | 8/2007 |
| WO | WO-2007102799 A2 | | 9/2007 |
| WO | WO-2008013780 A1 | | 1/2008 |
| WO | WO-2008054874 A2 | | 5/2008 |
| WO | WO-2008133660 A2 | | 11/2008 |
| WO | WO-2009016354 A1 | | 2/2009 |
| WO | WO-2009040553 | | 4/2009 |
| WO | WO-2009106810 A1 | | 9/2009 |

OTHER PUBLICATIONS

Pong, et al. "Modified Ligand-Exchange for Efficient SOlubilization of CdSe/ZnS Quantum Dots in Water: A procedure guided by computational studies" Langmuir, vol. 24 Apr. 16, 2008, pp. 5270-5276, XP002567180.

GB Search Report dated Sep. 17, 2009, for GB Application No. GB0901857.3.

International Search Report for PCT/GB2009/001928 mailed Dec. 8, 2009 (3 pages).

International Search Report for PCT/GB2009/002605 mailed Feb. 22, 2010 (3 pages).

Search Report for GB0813273.0 searched Dec. 8, 2008 (1 page).

Search Report for GB0814458.6 searched Dec. 5, 2008 (2 pages).

Search Report for GB0820101.4 searched Mar. 3, 2009 (1 page).

Agger, J.R. et al., "Growth of Quantum-Confined Indium Phosphide inside MCM-41," J. Phys. Chem. B (1998) 102, p. 3345.

Aldana, J. et al. "Photochemical Instability of CdSe Nanocrystals Coated by Hydrophilic Thiols", J. Am. Chem. Soc. (2001), 123: 8844-8850.

Alivisatos, A.P. "Perspectives on the Physical Chemistry of Semiconductor Nanocrystals", J. Phys. Chem., (1996), 100, pp. 13226-13239.

Arici et al., "Hybrid Solar Cells Based on Inorganic Nanoclusters and Conjugated Polymers", Thin Solid Films 451-452 (2004) 612-618.

Barron, "Group III Materials: New Phases and Nono-particles with Applications in Electronics and Optoelectronics," Office of Naval Research Final Report (1999).

Battaglia et al., "Colloidal Two-dimensional Systems: CdSe Quantum Shells and Wells," Angew Chem. (2003) 115:5189.

Bawendi, M.G. The Quantum Mechanics of Larger Semiconductor Clusters ("Quantum Dots"), Annu. Rev. Phys. Chem. (1990), 42: 477-498.

Berry, C.R. "Structure and Optical Absorption of AgI Microcrystals", Phys. Rev. (1967) 161: 848-851.

Bunge, S.D. et al. "Growth and morphology of cadmium chalcogenides: the synthesis of nanorods, tetrapods, and spheres from CdO and $Cd(O_2CCH_3)_2$", J. Mater. Chem. (2003) 13: 1705-1709.

Castro et al., "Nanocrystalline Chalcopyrite Materials ($CuInS_2$ and $CuInSe_2$) via Low-Temperature Pyrolysis of Molecular Single-Source Precursors", Chem. Mater. (2003) 15:3142-3147.

Castro et al., "Synthesis and Characterization of Colloidal CuInS2 Nanoparticles from a Molecular Single-Source Precursors," J. Phys. Chem, 8 (2004) 108:12429.

Chun et al., "Synthesis of $CuInGaSe_2$ Nanoparticles by Solvothermal Route", Thin Solid Films 480-481 (2005) 46-49.

Contreras et al., "$ZnO/ZnS(O,OH)/Cu(In,Ga)Se_2/Mo$ Solar Cell with 18:6% Efficiency," from 3d World Conf. on Photovol. Energy Conv., Late News Paper, (2003) pp. 570-573.

Cui et al., "Harvest of near infrared light in PbSe nanocrystal-polymer hybrid photovoltaic cells," Appl. Physics Lett. 88 (2006) 183111-183111-3.

Cumberland et al., "Inorganic Clusters as Single-Source Precursors for Preparation of CdSe, ZnSe, and CdSe/ZnS Nanomaterials" *Chemistry of Materials*, 14, pp. 1576-1584, (2002).

Dabousi et al., "(CdSe)ZnS Core—Shell Quantum Dots: Synthesis and Characterization of a Size Series of Highly Luminescent Nanocrystallites," Jrl. Phys. Chem.,(1997) 101, pp. 9463-9475.

Dance et al., "Syntheses, Properties, and Molecular and Crystal Structures of $(Me_4N)4[E_4M_{10}(SPh)_{16}]$ (E=S, Se; M=Zn, Cd): Molecular Supertetrahedral Fragments of the Cubic Metal Chalcogenide Lattice", J. Am. Chem. Soc. (1984) 106:6285.

Daniels et al., "New Zinc and Cadmium Chalcogenide Structured Nanoparticles," Mat. Res. Soc. Symp. Proc. 789 (2004).

Dehnen et al., "Chalcogen-Bridged Copper Clusters," Eur. J. Inorg. Chem., (2002) pp. 279-317.

Eisenmann et al., "New Phosphido-bridged Multinuclear Complexes of Ag and Zn," Zeitschrift fur anorganische und allgemeine Chemi (1995). (1 page—abstract).

Eychmüller, A. et al. "A quantum dot quantum well: CdS/HgS/CdS", Chem. Phys. Lett. 208, pp. 59-62 (1993).

Fendler, J.H. et al. "The Colloid Chemical Approach to Nanostructured Materials", Adv. Mater. (1995) 7: 607-632.

(56) References Cited

OTHER PUBLICATIONS

Gao, M. et al. "Synthesis of PbS Nanoparticles in Polymer Matrices", J. Chem. Soc. Commun. (1994) pp. 2779-2780.
Gou et al., "Shape-Controlled Synthesis of Ternary Chalcogenide $ZnIn_2S_4$ and $CuIn(S,Se)_2$ Nano-/Microstructures via Facile Solution Route", J. Am. Chem. Soc. (2006) 128:7222-7229.
Gur et al., "Air stable all-inorganic nanocrystal solar cells processed from solution," *Lawrence Berkeley Natl. Lab.*, Univ. of California, paper LBNL-58424 (2005).
Gurin, "Nanoparticles of Ternary Semiconductors in Colloids Low-Temperature Formation and Quantum Size Effects", Colloids Surf. A (1998) 142:35-40.
Guzelian, A. et al. "Colloidal chemical synthesis and characterization of InAs nanocrystal quantum dots", Appl. Phys. Lett. (1996) 69: 1432-1434.
Guzelian, A. et al., "Synthesis of Size-Selected, Surface-Passivated InP Nanocrystals", *J. Phys. Chem.* (1996) 100: 7212.
Hagfeldt, A. et al. "Light-induced Redox Reactions in Nanocrystalline Systems", Chem. Rev. (1995) 95: 49-68.
Henglein, A. "Small-Particle Research: Physicochemical Properties of Extremely Small Colloidal Metal and Semiconductor Particles", Chem Rev. (1989) 89: 1861-1873.
Hirpo et al., "Synthesis of Mixed Copper-Indium Chalcogenolates. Single-Source Precursors for the Photovoltaic Materials CuInQ2 (Q=S, Se)," J. Am. Chem. Soc. (1993) 115:1597.
Hu et al., "Hydrothermal Preparation of $CuGaS_2$ Crystallites with Different Morphologies", Sol. State Comm. (2002) 121:493-496.
Huang et al., "Bio-Inspired Fabrication of Antireflection Nanostructures by Replicating Fly Eyes", *Nanotechnology* (2008) vol. 19.
International Search Report for PCT/GB2005/001611 mailed Sep. 8, 2005 (5 pages).
International Search Report for PCT/GB2006/003028 mailed Jan. 22, 2007 (5 pages).
Jegier, J.A. et al. "Poly(imidogallane): Synthesis of a Crystalline 2-D Network Solid and Its Pyrolysis to Form Nanocrystalline Gallium Nitride in Supercritical Ammonia", Chem. Mater. (1998) 10: 2041-2043.
Jiang et al., "Elemental Solvothermal Reaction to Produce Ternary Semiconductor $CuInE_2$ (E=S, Se) Nnaorods", Inorg. Chem. (2000) 39:2964-2965.
Kaelin et al., "CIS and CIGS layers from selenized nanoparticle precursors," Thin Solid Films 431-432 (2003) pp. 58-62.
Kapur et al., "Non-Vacuum processing of $CuIn_{1-x}GaxSe_2$ solar cells on rigid and flexible substrates using nanoparticle precursor inks," Thin Solid Films 431-432 (2003) pp. 53-57.
Kher, S. et al. "A Straightforward, New Method for the Synthesis of Nanocrystalline GaAs and GaP", Chem. Mater. (1994) 6: 2056-2062.
Kim et al. "Engineering InAsxP1-x/InP/ZnSe III-V Alloyed Core-Shell Quantum Dots for the Near-Infrared" JACS Articles published on web Jul. 8, 2005.
Kim et al., "Synthesis of $CuInGaSe_2$ Nanoparticles by Low Temperature Colloidal Route", J. Mech. Sci. Tech. (2005) 19:2085-2090.
Law et al., "Nanowire dye-sensitized solar cells," Nature Mater. (2005) vol. 4 pp. 455-459.
Li et al., "Synthesis by a Solvothermal Route and Characterization of $CuInSe_2$ Nanowhiskers and Nanoparticles", Adv. Mat. (1999) 11:1456-1459.
Lieber, C. et al. "Understanding and Manipulating Inorganic Materials with Scanning Probe Microscopes", *Angew. Chem. Int. Ed. Engl.* (1996) 35: 687-704.
Little et al., "Formation of Quantum-dot quantum-well heteronanostructures with large lattice mismatch: Zn/CdS/ZnS," 114 J. Chem. Phys. 4 (2001).
Lover, T. et al. "Preparation of a novel CdS nanocluster material from a thiophenolate-capped CdS cluster by chemical removal of SPh ligands", *J. Mater. Chem.* (1997) 7(4): 647-651.
Lu et al., "Synthesis of Nanocrystalline $CuMS_2$ (M=In or Ga) Through a Solvothermal Process", Inorg. Chem. (2000) 39:1606-1607.
Malik et al., "A Novel Route for the Preparation of CuSe and $CuInSe_2$ Nanoparticles", Adv. Mat., (1999) 11:1441-1444.
Materials Research Society Symposium Proceedings *Quantum Dots, Nanoparticles and Nanowires*, 2004, ISSN: 0272-9172.
Matijevic, E. "Production of Mondispersed Colloidal Particles", Ann. Rev. Mater. Sci. (1985) 15: 483-518.
Matijevic, E., "Monodispersed Colloids: Art and Science", Langmuir (1986) 2:12-20.
Mekis, I. et al., "One-Pot Synthesis of Highly Luminescent CdSe/ CdS Core-Shell Nanocrystals via Organometallic and "Greener" Chemical Approaches", *J. Phys. Chem. B*. (2003) 107: 7454-7462.
Mews et al., "Preparation, Characterization, and Photophysics of the Quantum Dot Quantum Well System CdS/HgS/CdS", J. Phys. Chem. (1994) 98:934.
Mićić et al., "Synthesis and Characterization of InP, GaP, and $GaInP_2$ Quantum Dots", *J. Phys. Chem.* (1995) pp. 7754-7759.
Milliron et al., "Electroactive Surfactant Designed to Mediate Electron Transfer between CdSe Nanocrystals and Organic Semiconductors," Adv. Materials (2003) 15, No. 1, pp. 58-61.
Murray, C.B. et al., "Synthesis and Characterization of Nearly Monodisperse CdE (E=S, Se, Te) Semiconductor Nanocrystallites", *J. Am. Chem. Soc.* (1993) 115 (19) pp. 8706-8715.
Müller et al., "From Giant Molecular Clusters and Precursors to Solid-state Structures," *Current Opinion in Solid State and Materials Science*, 4 (Apr. 1999) pp. 141-153.
Nairn et al., "Preparation of Ultrafine Chalcopyrite Nanoparticles via the Photochemical Decomposition of Molecular Single-Source Precursors", Nano Letters (2006) 6:1218-1223.
Nazeeruddin et al., "Conversion of Light to Electricity by *cis*-$X_2Bis(2,2'$-bipyridyl-4,4'—dicarboxylate)ruthenium(II) Charge-Transfer Sensitizers (X=Cl-, Br-, I-, CN-, and SCN-) on Nanocrystalline $TiO_2$ Electrodes," J. Am. Chem. Soc. (1993) 115:6382-6390.
Nazeeruddin et al., "Engineering of Efficient Panchromatic Sensitizers for Nanocrystalline $TiO_2$-Based Solar Cells," J. Am. Chem. Soc. (2001) 123:1613-1624.
Nielsch et al., "Uniform Nickel Deposition into Ordered Alumina Pores by Pulsed Electrodeposition", *Advanced Materials*, 2000 vol. 12, No. 8, pp. 582-586.
O'Brien et al., "The Growth of Indium Selenide Thin Films from a Novel Asymmetric Dialkydiselenocarbamate," 3 Chem. Vap. Depos. 4, pp. 227 (1979).
Olshavsky, M.A., et al. "Organometallic Synthesis of GaAs Crystallites Exhibiting Quantum Confinement", J. Am. Chem. Soc. (1990) 112: 9438-9439.
Olson et al., "Effect of Polymer Processing on the Performance of Poly(3-hexylthiophene)/ZnO Nnaorod Photovoltaic Devices", J. Phys. Chem. C. (2007) 111:16640-16645.
Patent Act 1977 Search Report under Section 17 for Application No. GB0522027.2 dated Jan. 27, 2006 (1 page).
Patent Act 1977 Search Report under Section 17 for Application No. GB0606845.6 dated Sep. 14, 2006.
Patent Act 1977 Search Report under Section 17 for Application No. GB0719073.9.
Patent Act 1977 Search Report under Section 17 for Application No. GB0719075.4.
Patent Act 1977 Search Report under Section 17 for Application No. GB0723539.3 dated Mar. 27, 2008 (1 page).
Patents Act 1977: Search Report under Section 17 for Application No. GB0409877.8 dated Oct. 7, 2004 (2 pages).
Peng et al., "Kinetics of I-VI and III-V Colloidal Semiconductor Nanocrystal Growth: "Focusing" os Size Distributions", J. Am. Chem. Soc., (1998) 129: 5343-5344.
Peng et al., "Mechanisms of the Shape Evolution of CdSe Nanocrystals", J. Am. Chem. Soc. (2001) 123:1389.
Peng et al., "Shape control of CdSe nanocrystals", *Nature* (2000) vol. 404, No. 6773, pp. 59-61.
Pradhan, N. et al. "Single-Precursor, One-Pot Versatile Synthesis under near Ambient Conditions of Tunable, Single and Dual Band Flourescing Metal Sulfide Nanoparticles", J. Am. Chem. Soc. (2003) 125: 2050-2051.
Qi et al., "Efficient polymer-nanocrystal quantum-dot photodetectors," Appl. Physics Lett. 86 (2005) 093103-093103-3.

(56) References Cited

OTHER PUBLICATIONS

Qu, L. et al. "Alternative Routes toward High Quality CdSe Nanocrystals", Nano Lett. (2001) vol. 1, No. 6, pp. 333-337.

Rao et al. (2004) "The Chemistry of Nanomaterials: Synthesis, Properties and Applications" p. 443.

Robel et al., "Quantum Dot Solar Cells. Harvesting Light Energy with CdSe Nanocrystals Molecularly Linked to Mesoscopic $TiO_2$ Films," J. Am. Chem. Soc. (2006) 128: 2385-2393.

Salata, O.V. et al. "Uniform GaAs quantum dots in a polymer matrix", Appl. Phys. Letters (1994) 65(2): 189-191.

Sercel, P.C. et al. "Nanometer-scale GaAs clusters from organometallic percursors", Appl. Phys. Letters (1992) 61: 696-698.

Shulz et al., "Cu-In-Ga-Se Nanoparticle Colloids as Spray Deposition Precursors for $Cu(In,Ga)Se_2$ Solar Cell Materials", J. Elect. Mat. (1998) 27:433-437.

Steigerwald, M.L. et al. "Semiconductor Crystallites: A Class of Large Molecules" *Acc. Chem. Res.* (1990) 23: 183-188.

Stroscio, J.A. et al. "Atomic and Molecular Manipulation with the Scanning Tunneling Microscope", Science (1991), 254: 1319-1326.

Timoshkin, "Group 13 imido metallanes and their heavier analogs [RMYR']n (M=AL, Ga, In; Y=N, P, As, Sb)," Coordination Chemistry Reviews (2005).

Trinidade et al., "A Single Source Spproach to the Synthesis of CdSe Nanocrystallites", *Advanced Materials*, (1996) vol. 8, No. 2, pp. 161-163.

Trinidade et al., "Nanocrystalline Seminconductors: Synthesis, Properties, and Perspectives", Chemistry of Materials, (2001) vol. 13, No. 11, pp. 3843-3858.

Vayssieres et al., "Highly Ordered $SnO_2$ Nanorod Arrays from Controlled Aqueous Growth," Angew. Chem. Int. Ed. (2004) 43: 3666-3670.

Vittal, "The chemistry of inorganic and organometallic compounds with adameantane-like structures," Polyhedron, vol. 15, No. 10, pp. 1585-1642 (1996).

Wang Y. et al. "PbS in polymers, From molecules to bulk solids", J. Chem. Phys. (1987) 87: 7315-7322.

Weller, H. "Colloidal Semiconductor Q-Particles: Chemistry in the Transition Region Between Solid State and Molecules", Angew. Chem. Int. Ed. Engl. (1993) 32: 41-53.

Weller, H. "Quantized Semiconductor Particles: A Novel State of Mater for Materials Science", Adv. Mater. (1993) 5: 88-95.

Wells, R.L. et al. "Synthesis of Nanocrystalline Indium Arsenide and Indium Phosphide from Indium(III) Halides and Tris (trimethylsilyl)pnicogens. Synthesis, Characterization, and Decomposition Behavior of I3In-P(SiMe3)3", Chem. Mater. (1995) 7: 793-800.

Xiao et al., "A Mild Solvothermal Route to Chalcopyrite Quaternary Semiconductor $CuIn(Se_xS_{1-x})_2$ Nanocrystallites", J. Mater. Chem. (2001) 11:1417-1420.

Xie et al. "Synthesis and Characterization of Highly Luminescent CdSe-Core CdS/Zn0.5Cd0.5S/ZnS Multishell Nanocrystals" JACS Articles published on web Apr. 29, 2005.

Yang et al., "Studies of Electrochemical Synthesis of Ultrathin ZnO Nanorod/Nanobelt Arrays on Zn Substrates in Alkaline Solutions of Amine-Alcohol Mixtures", Crystal Growth & Design (2007) 12:2562-2567.

Yu et al., "Polymer Photovoltaic Cells: Enhanced Efficiencies via a Network of Internal Donor-Acceptor Heterojunctions," 270 Science 5243 (1995), pp. 1789-1791.

Zhong et al, "Composition-Tunable $Zn_xCu_{1-x}Se$ Nanocrytals with High Luminescence and Stability", Jrl Amer. Chem. Soc. 2003.

Zhong et al., "A Facile Route to Synthesize Chalcopyrite CuInSe2 Nanocrystals in Non-Coordinating Coordinating Solvent", Nanotechnology 18 (2007) 025602.

Sheng et al. "In-Situ Encapsulation of Quantum Dots into Polymer Microsphers", Langmuir 22(8):3782-3790 (2006).

W. Peter Wuelfing et al., "Supporting Information for Nanometer Gold Clusters Protected by Surface Bound Monolayers of Thiolated Poly (ethylene glycol) Polymer Electrolyte" Journal of the American Chemical Society (XP002529160) (1998).

International Search Report for PCT/GB2009/000510 mailed Jul. 6, 2010 (16 pages).

International Search Report for PCT/GB2008/003958 mailed Sep. 4, 2009 (3 pages).

Banger et al., "Ternary single-source precursors for polycrystalline thin-film solar cells" Applied Organometallic Chemistry, 16:617-627, XP002525473 Scheme 1 Chemical Synthesis (2002).

D Qi, M Fischbein, M Drndic, S. Selmic, "Efficient polymer-nanocrystal quantum-dot photodetectors", Appl. Phys. Lett., 2004, 84, 4295.

Shen et al., "Photoacoustic and photoelectrochemical characterization of CdSe-sensitized Ti02 electrodes composed of nanotubes and nanowires" Thin Solid Films, Elsevier-Sequoia S.A. Lausanne, CH vol. 499, No. 1-2, Mar. 21, 2006, pp. 299-305, XP005272241 ISSN: 0040-6090.

Smestad GP, et al., "A technique to compare polythiophene solid-state dye sensitized Ti02 solar cells to liquid junction devices" Solar Energy Materials and Solar Cells, Elsevier Science Publishers, Amsterdam, NL, vol. 76, No. 1, Feb. 15, 2003), pp. 85-105, XP004400821 ISSN: 0927-0248.

Chen et al., "Electrochemically synthesized CdS nanoparticle-modified Ti02 nanotube-array photoelectrodes: Preparation, characterization, and application to photoelectrochemical cells" Journal of Photochemistry and Photobiology, a: Chemistry, Elsevier Sequoia Lausanne, CH, vol. 177, No. 2-3, Jan. 25, 2006, pp. 177-184, XP005239590 ISSN: 1010-6030.

Wang, et al., "In situ polymerization of amphiphilic diacetylene for hole transport in solid state dye-sensitized solar cells" Organic Electronics, El Sevier, Amsterdam NL, vol. 7, No. 6, Nov. 18, 2006, pp. 546-550, XP005773063 ISSN: 1566-1199.

International Search Report and Written Opinion for PCT/GB2008/001457 mailed Aug. 21, 2008 (14 pages).

Richardson et al., "Chemical Engineering: Chemical and Biochemical Reactors and Process Control," vol. 3, Third Edition, pp. 3-5 (1994).

Borchert et al., "High Resolution Photoemission STudy of CdSe and CdSe/ZnS Core-Shell Nanocrystals," Journal of Chemical Physics, vol. 119, No. 3, pp. 1800-1807 (2003).

Gaponik et al., "Thiol-Capping of CdTe Nanocrystals: An Alternative to Organomettalic Synthetic Routes," Journal of Physical Chemistry B, vol. 106, No. 29, pp. 7177-7185 (2002).

Pickett et al., "Syntheses of Semiconductor Nanoparticles Using Single-Molecular Precursors," The Chemical Record, vol. 1 pp. 467-479 (2001).

Hu et al., Solar Cells: From basics to advanced systems. McGraw-Hill Book Co. pp. 73-74 (1983).

Talapin et al. "Synthesis of Surface-Modified Colloidal Semiconductor Nanocrystals and Study of Photoinduced Charge Separation and Transport in Nanocrystal-Polymer Composites," Physica E, vol. 14, pp. 237-241 (2002).

Cao, (2005) "Effect of Layer Thickness on the Luminescence Properties of ZnS/CdS/ZnS quantum dot quantum well", J. of Colloid and Interface Science 284:516-520.

Foneberov et al., (2005) "Photoluminescence of tetrahedral quantum-dot quantum wells" Physica E, 26:63-66.

Harrison et al. (2000) "Wet Chemical Synthesis on Spectroscopic Study of CdHgTe Nanocrystals with Strong Near-Infrared Luminescence" Mat. Sci and Eng.B69-70:355-360.

Search Report for GB0821 122.9 searched Mar. 19, 2009 (2 pages).

\* cited by examiner

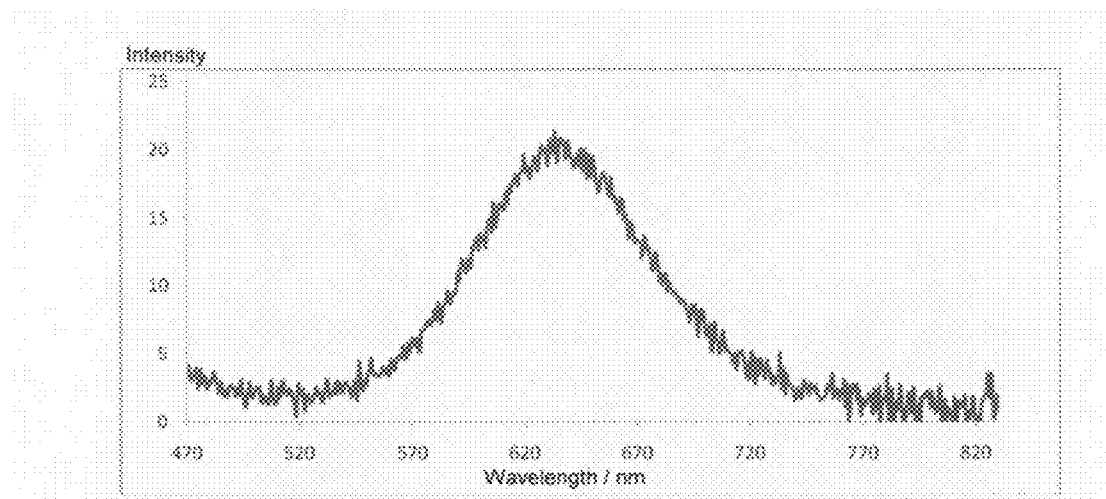
Figure 8
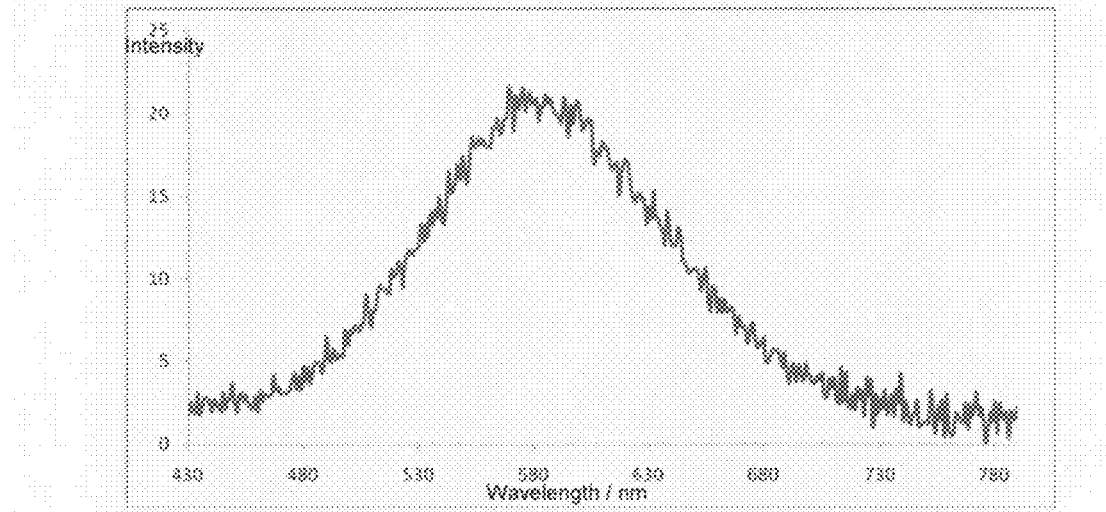
Figure 9
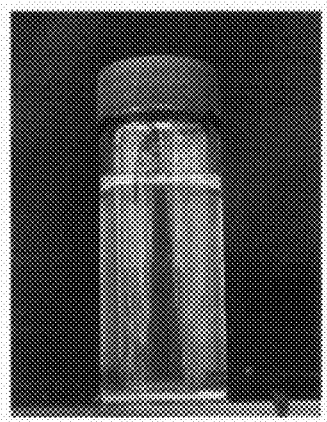 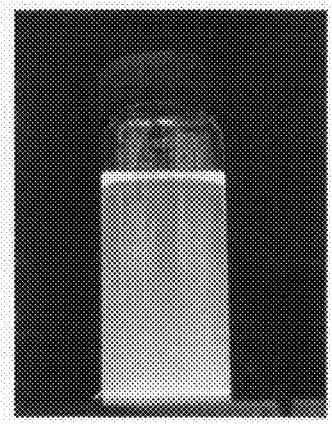
Figure 10A    Figure 10B

METHOD FOR PRODUCING AQUEOUS COMPATIBLE NANOPARTICLES

RELATED APPLICATIONS

This application claims the benefit of and priority to U.S. Provisional Patent Application Ser. No. 61/082,335, filed Jul. 21, 2008, the entire content of which is incorporated herein by reference. This application also claims the benefit of GB 0813273.0 filed Jul. 19, 2008, the entire content of which is incorporated herein by reference.

FIELD OF THE INVENTION

The present invention relates to the synthesis of aqueous compatible nanoparticles, particularly, but not exclusively, semiconductor nanoparticles, such as core, core/shell or core/multishell semiconductor nanoparticles that can be substantially dispersed or dissolved in aqueous media.

BACKGROUND

Fluorescent organic molecules typically suffer from disadvantages that include photo-bleaching, different excitation irradiation frequencies, and broad emissions. However, the substitution of fluorescent organic molecules with quantum dot semiconductor nanoparticles may circumvent these limitations.

The size of a semiconductor nanoparticle dictates the electronic properties of the material, with the band gap energy being inversely proportional to the size of the semiconductor nanoparticles as a consequence of quantum confinement effects. Different-sized quantum dots may be excited by irradiation with a single wavelength of light to give a discrete fluorescence emission of narrow band width. Further, the large surface-area-to-volume ratio of the nanoparticle typically has a profound impact upon the physical and chemical properties of the quantum dot.

Nanoparticles that include a single semiconductor material usually have modest physical/chemical stability and consequently relatively low fluorescence quantum efficiencies. These low quantum efficiencies arise from non-radiative electron-hole recombinations that occur at defects and dangling bonds at the surface of the nanoparticle.

Core-shell nanoparticles comprise a semiconductor core with a shell material of typically wider band-gap and similar lattice dimensions grown epitaxially on the surface of the core. The shell reduces defects and dangling bonds from the surface of the core, that confines charge carriers within the core and away from surface states that may function as centers for non-radiative recombination. More recently, the architecture of semiconductor nanoparticles has been further developed to include core/multishell nanoparticles in which the core semiconductor material is provided with two or more shell layers to further enhance the physical, chemical and/or optical properties of the nanoparticles.

The surfaces of core and core/(multi)shell semiconductor nanoparticles often possess highly reactive dangling bonds that may be passivated by coordination of a suitable ligand, such as an organic ligand compound. The ligand compound is typically either dissolved in an inert solvent or employed as the solvent in the nanoparticle core growth and/or shelling procedures that are used to synthesise the quantum dots. Either way, the ligand compound chelates the surface of the quantum dot by donating lone pair electrons to the surface metal atoms, which tends to inhibit aggregation of the particles, protect the particle from its surrounding chemical environment, provide electronic stabilisation, and may impart solubility in relatively non-polar media.

The widespread application of quantum dot nanoparticles in aqueous environments (i.e., media comprised primarily of water) has been restricted by the incompatibility of quantum dots with aqueous media, that is, the inability to form stable systems with quantum dots dispersed or dissolved in aqueous media. Consequently, a series of surface modification procedures have been developed to render quantum dots aqueous compatible, i.e., dots that may disperse homogeneously in water or media comprised primarily of water.

A procedure widely used to modify the surface of a quantum dot is known as "ligand exchange." Lipophilic ligand molecules that inadvertently coordinate to the surface of the quantum dot during core synthesis and/or shelling procedures are subsequently exchanged with a polar/charged ligand compound of choice.

An alternative surface modification strategy interchelates polar/charged molecules or polymer molecules with the ligand molecules that are already coordinated to the surface of the quantum dot.

Current ligand exchange and interchelation procedures may render the quantum dot nanoparticles compatible with aqueous media but typically result in materials of lower quantum yield and/or substantially larger size than the corresponding unmodified quantum dot.

SUMMARY

Embodiments of the present invention may obviate or mitigate one or more of the challenges discussed above with current methods for producing aqueous compatible nanoparticles.

Some embodiments of the invention pertain to a method for producing aqueous compatible nanoparticles using a nanoparticle binding ligand incorporating a nanoparticle binding group and a solubilising group precursor. The solubilising group precursor is converted to a solubilising group. Nanoparticles are contacted with a binding ligand incorporating the solubilising group so as to effect binding of the binding ligand to the nanoparticles and thereby produce the aqueous compatible nanoparticles.

One or more of the following features may be included. The conversion of the solubilising group precursor may be effected by several methods, e.g., by contacting the nanoparticle binding ligand with a sufficient amount of a precursor modifying agent to convert substantially all of the solubilising group precursors present in the binding ligand to solubilising groups.

The conversion of the solubilising group precursor may also be effected by contacting the nanoparticle binding ligand with an approximately stoichiometric amount of a precursor modifying agent based on the amount of solubilising group precursor present in the binding ligand.

Moreover, the conversion of the solubilising group precursor may be effected by treating the precursor with an ionizing agent and/or at least one of a Lewis acid or a Lewis base compound and/or an organic base and/or at least one of an ammonium salt or an alkoxide salt. The ammonium salt may be, e.g., tetramethylammonium hydroxide, tetraethylammonium hydroxide and/or tetrabutylammonium hydroxide.

The conversion of the solubilising group precursor may be effected in a first solvent and contacting the nanoparticles with the nanoparticle binding ligand incorporating the solubilising group may be effected in a separate second solvent.

The solubilising group precursor may include an ionisable group. The solubilising group precursor may include sulfur, nitrogen, oxygen, and/or phosphorous atoms. The solubilising group precursor may be hydroxide, alkoxide, carboxylic acid, carboxylate ester, amine, nitro, polyethyleneglycol, sulfonic acid, sulfonate ester, phosphoric acid, and/or phosphate ester.

The solubilising group may be a charged or a polar group. In some embodiments, the solubilising group may be a hydroxide salt, alkoxide salt, carboxylate salt, ammonium salt, sulfonate salt, and/or a phosphate salt. In still other embodiments, the nanoparticle binding group may be a Lewis base.

The nanoparticle binding group may include a sulfur, nitrogen, oxygen and/or phosphorous atom. In some embodiments, the nanoparticle binding group may include a thio group, an amino group, an oxo group, and/or a phospho group.

The nanoparticle binding group and the solubilising group may be connected via a linker, such as a covalent bond; a carbon, nitrogen, oxygen or sulfur atom; a substituted or unsubstituted, saturated or unsaturated aliphatic or alicyclic group; and/or a substituted or unsubstituted aromatic group.

The linker may incorporate one or more ethylene oxide repeating units. For example, the linker may incorporate up to around 2000 ethylene oxide repeating units, e.g., around 20 to around 100 ethylene oxide repeating units.

The ligand incorporating the solubilising group precursor may be a mercaptocarboxylic acid. The mercaptocarboxylic acid may incorporate one or more ethylene oxide repeating units, e.g., up to around 2000 ethylene oxide repeating units, such as around 20 to around 100 ethylene oxide repeating units. The mercaptocarboxylic acid may incorporate a functional group such as an amine group and/or an amide group.

The nanoparticles contacted by the binding ligand may be semiconductor nanoparticles. The nanoparticles may include one or more semiconductor materials, such as CdS, CdSe, CdTe, ZnS, ZnSe, ZnTe, InP, InAs, InSb, AlP, AlS, AlAs, AlSb, GaN, GaP, GaAs, GaSb, PbS, PbSe, Si, Ge, MgS, MgSe, MgTe and combinations thereof. The nanoparticles contacted by the binding ligand may be core, core/shell or core/multishell nanoparticles.

An aqueous compatible nanoparticle may be produced by using the methods described above, the aqueous compatible nanoparticle including a nanoparticle bound to a nanoparticle binding ligand, the ligand incorporating a nanoparticle binding group and a solubilising group.

Some embodiments of the invention pertain to an aqueous compatible nanoparticle including a nanoparticle bound to a mercaptocarboxylic acid incorporating one or more ethylene oxide repeating units.

BRIEF DESCRIPTION OF THE DRAWINGS

FIG. 8 is an emission spectrum of aqueous compatible InP/ZnS/ZnO semiconductor nanoparticles incorporating a $HS—C_2H_4—CONH—(PEG)_n—C_3H_6—CO_2^{-+}NBu_4$ surface binding ligand prepared according to a preferred embodiment of the present invention (see Example 2);

FIG. 9 is an emission spectrum of aqueous compatible InP/ZnS/ZnO semiconductor nanoparticles incorporating a $Bu_4N^{+-}S—C_2H_4—CONH—(PEG)_n—C_3H_6—CO_2^{-+}NBu_4$ surface binding ligand prepared according to a preferred embodiment of the present invention (see Example 3); and FIGS. 10A and 10B are photographs of $HS—C_2H_4—CONH—(PEG)_n—C_3H_6—CO_2^{-+}NBu_4$ modified quantum dots in water irradiated with ambient light (FIG. 10A) and 365 nanometer (nm) light (FIG. 10B).

DETAILED DESCRIPTION

Figure 1:
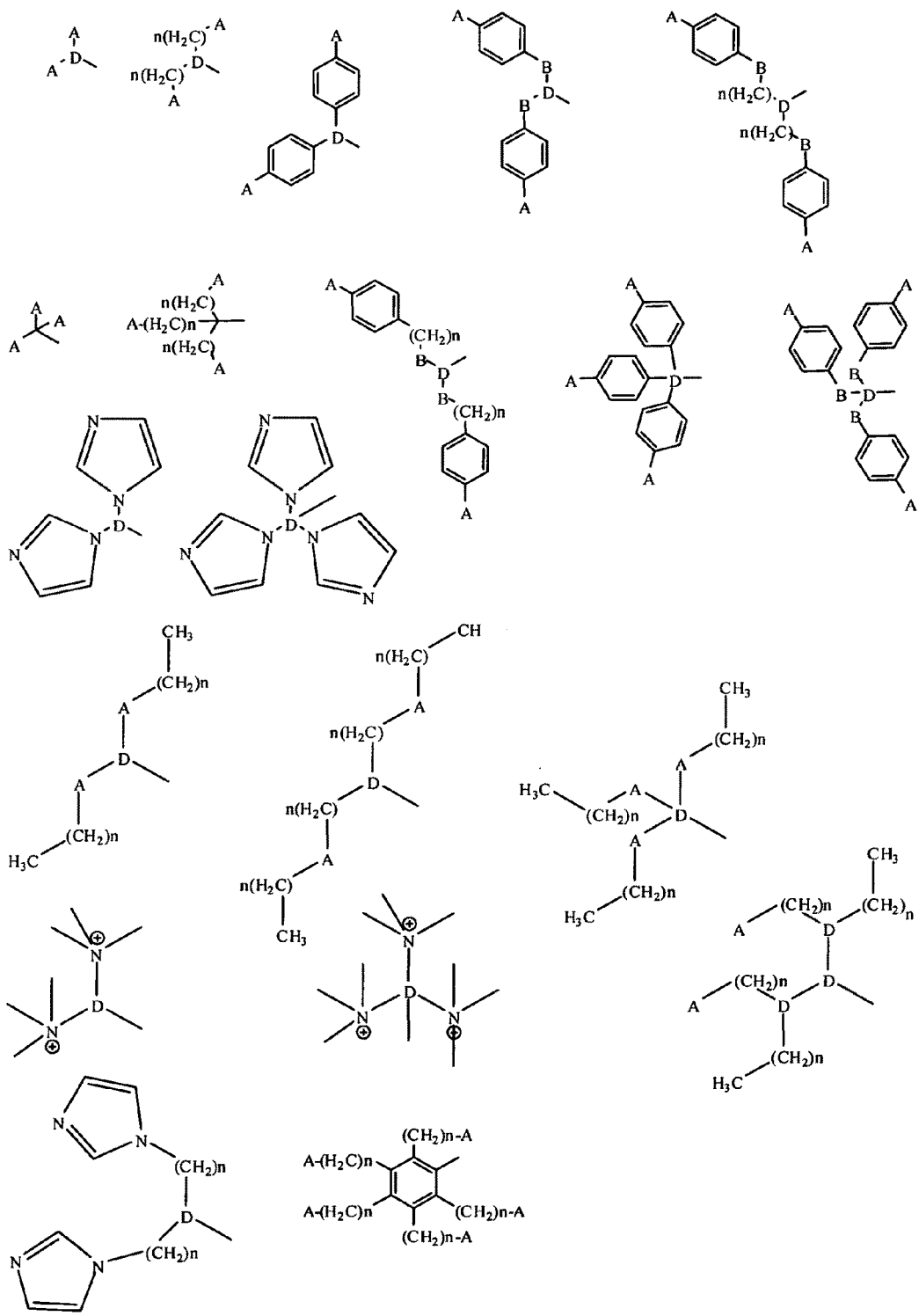
FIG. 1 is a non-exhaustive list of exemplary multidentate groups.
Figure 2:
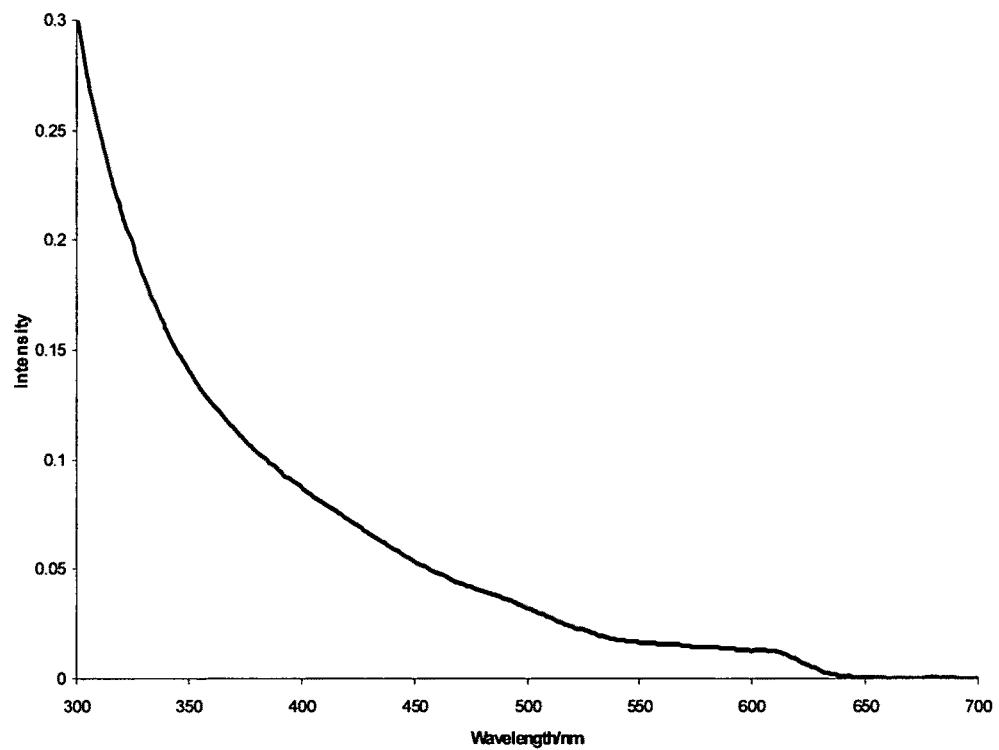
FIG. 2 is an absorption spectrum of CdSe/CdZnS/ZnS/HDA-TOPO semiconductor nanoparticles that may be modified using a method according to an embodiment of the present invention to render the nanoparticles aqueous compatible (see Example 1)
Figure 3:
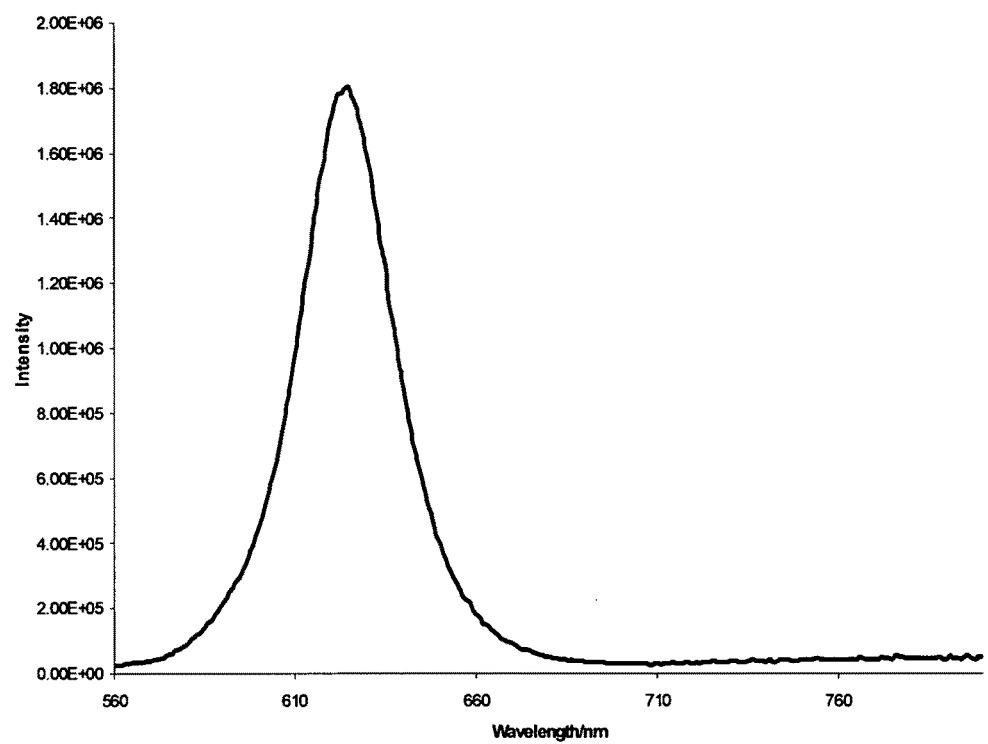
FIG. 3 is an emission spectrum of CdSe/CdZnS/ZnS/HDA-TOPO semiconductor nanoparticles that may be modified using a method according to an embodiment of the present invention to render the nanoparticles aqueous compatible (see Example 1)
Figure 4:
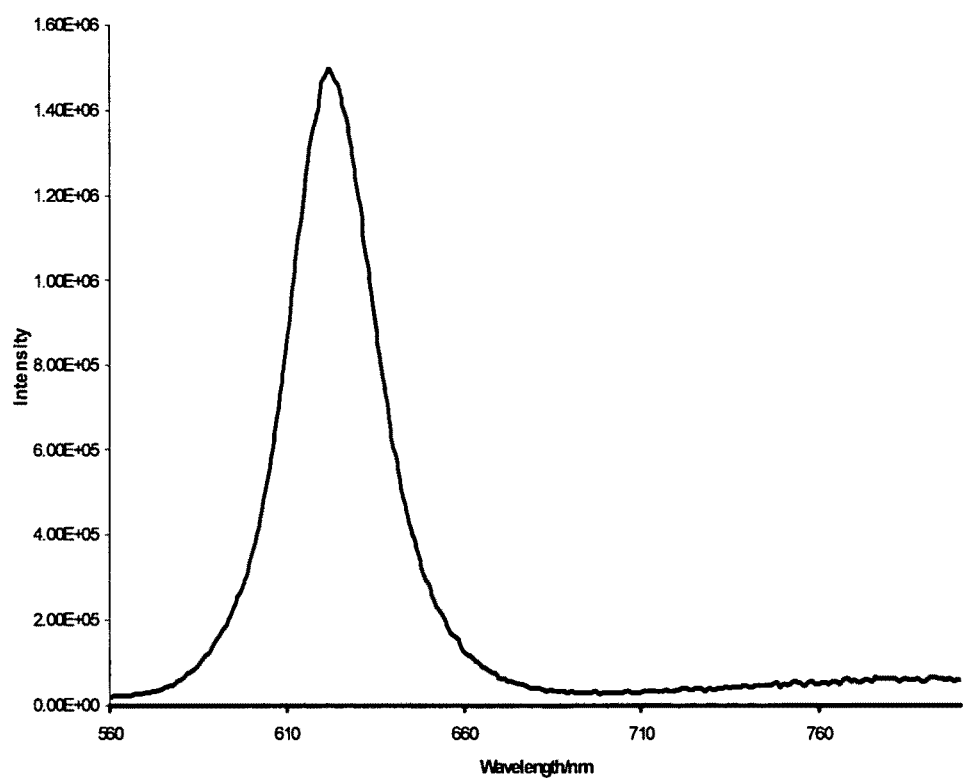
FIG. 4 is an emission spectrum of CdSe/CdZnS/ZnS/ $Bu_4N^{+-}SCH_2CH(NH_2)CO_2^{-+}NBu_4$ aqueous compatible semiconductor nanoparticles that have been modified using a method according to an embodiment of the present invention to bestow aqueous compatibility to the nanoparticles (see Example 1)
Figure 5:
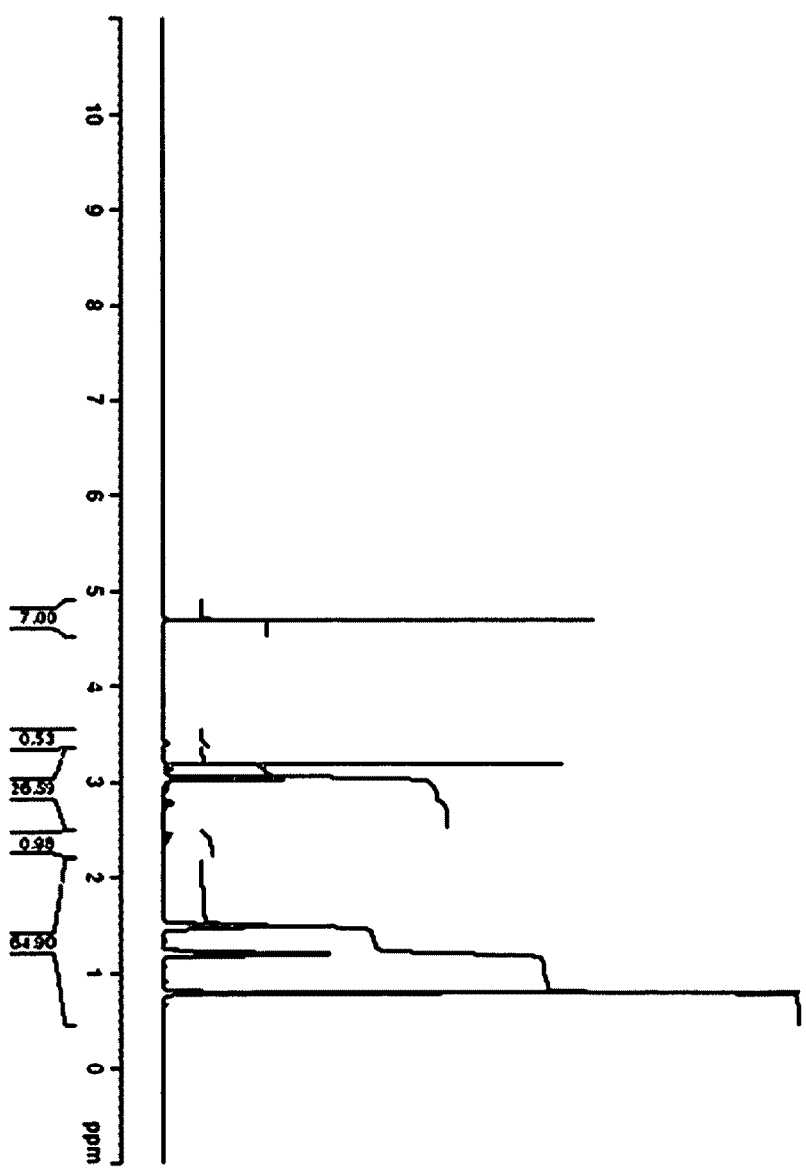
FIG. 5 is a $^1$H-NMR spectrum of an exemplary ligand, $Bu_4N^{+-}SCH_2CH(NH_2)CO_2^{-+}NBu_4$ that may be employed in a method according to an embodiment of the present invention (see Example 1)
Figure 6:
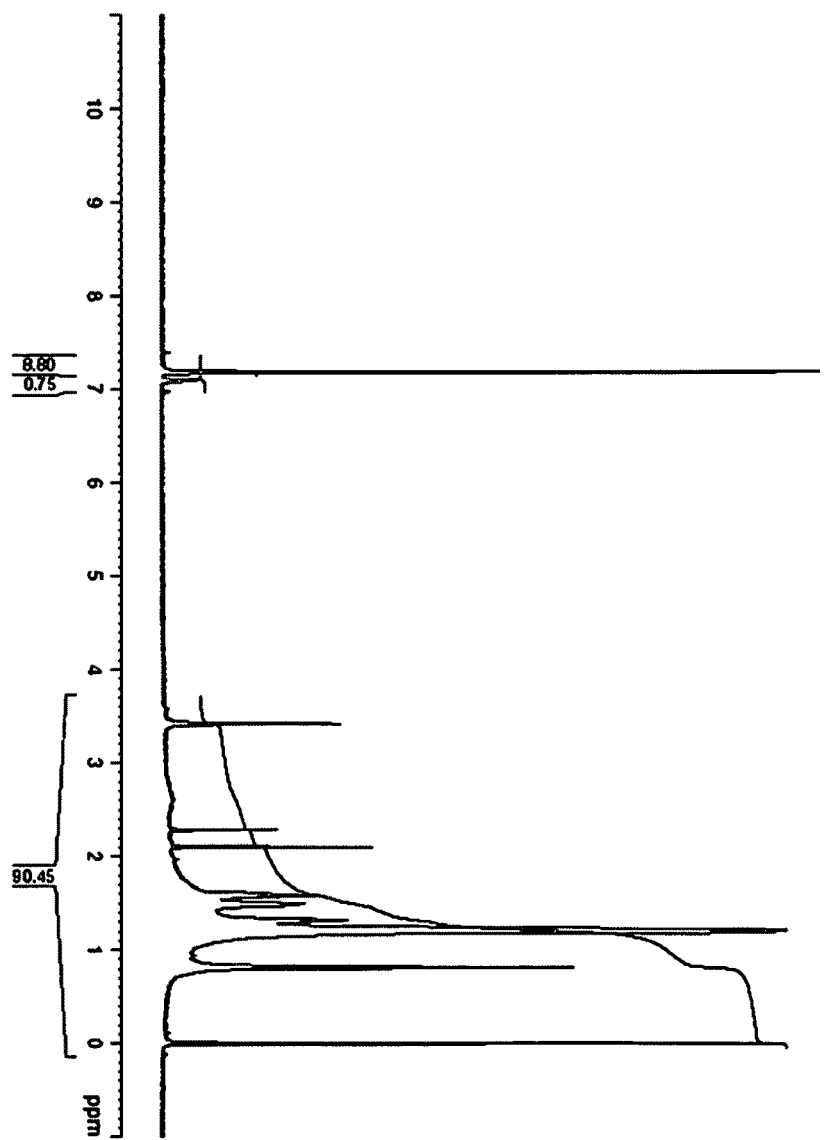
FIG. 6 is a $^1$H-NMR spectrum of CdSe/CdZnS/ZnS/HDA-TOPO semiconductor nanoparticles that may be modified using a method according to an embodiment of the present invention to render the nanoparticles aqueous compatible (see Example 1)
Figure 7:
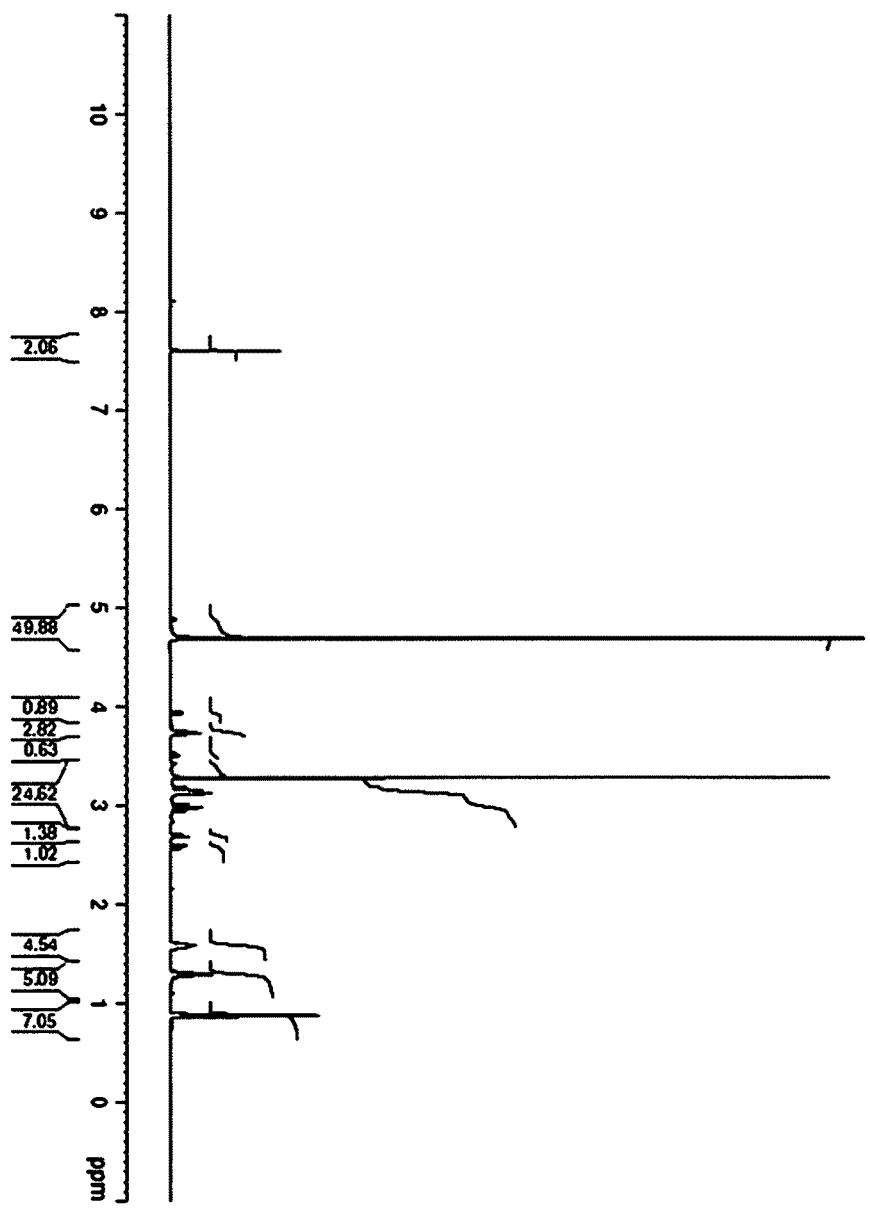
FIG. 7 is a $^1$H-NMR spectrum of CdSe/CdZnS/ZnS/ $Bu_4N^{+-}SCH_2CH(NH_2)CO_2^{-+}NBu_4$ aqueous compatible semiconductor nanoparticles that have been modified using a method according to an embodiment of the present invention to bestow aqueous compatibility to the nanoparticles (see Example 1)

According to a first aspect of the present invention, a method is provided for producing aqueous compatible nanoparticles using a nanoparticle binding ligand incorporating a nanoparticle binding group and a solubilising group precursor, the method including:
  a. converting the solubilising group precursor to a solubilising.group, and
  b. contacting nanoparticles with the binding ligand incorporating the solubilising group so as to effect binding of said binding ligand to the nanoparticles.

Embodiments of the present invention include a method for at least partially coating the surface of nanoparticles with a pre-modified ligand to render the nanoparticles aqueous compatible. By modifying the ligand before binding to the nanoparticle surface, undesirable and potentially deleterious post-binding modification steps are avoided. Quantum dot semiconductor nanoparticles formed in accordance with embodiments of the present invention may thus be stably dispersed or dissolved in aqueous media, physically/chemically robust, exhibit high quantum yield, and relatively small in size. The results of Example 1 presented below demonstrate that the initial quantum yield of aqueous compatible quantum dots produced according to embodiments of the present invention fell by significantly less than quantum dots made of the same semiconductor material but rendered aqueous compatible using prior art methods. Moreover, the final quantum yield exhibited by the quantum dots produced in Example 1 below was increased beyond that of the dots before or after addition of the ligand containing the solubilising group by subjecting the dots to an appropriate annealing process.

A second aspect of the present invention provides an aqueous compatible nanoparticle produced using the method according to the first aspect of the present invention, the aqueous compatible nanoparticle including a nanoparticle bound to a nanoparticle binding ligand, the ligand incorporating a nanoparticle binding group and a solubilising group.

A third aspect of the present invention provides an aqueous compatible nanoparticle including a nanoparticle bound to a mercaptocarboxylic acid incorporating one or more ethylene oxide repeating units. Preferred mercaptocarboxylic acid—based nanoparticle binding ligands are discussed in more detail below.

Aqueous compatible quantum dots produced according to embodiments of the present invention may be employed in many different applications including, but not limited to, incorporation into polar solvents (e.g., water and water-based solvents), electronic devices, inks, polymers, glasses or attachment of the quantum dot nanoparticles to cells, biomolecules, metals, molecules and the like.

A further aspect of the present invention provides aqueous compatible nanoparticles, for example quantum dot semiconductor nanoparticles, including nanoparticles bound to nanoparticle surface binding ligands, each ligand incorporating a nanoparticle surface binding group and a solubilising group. More particularly, the present invention relates to quantum dot semiconductor nanoparticles at least partially coated with a ligand that imparts aqueous compatibility to the nanoparticles and can afford chemical functionality, stability and/or enhanced fluorescence to the nanoparticles.

Prior art post-binding surface treatment procedures modify a solubilising group precursor ligand compound when bound to the surface of the nanoparticles.

Such procedures often result in excess ligand modifying reagent being added inadvertently, which may be detrimental to the desired physical, chemical and/or optical properties of the resulting nanoparticles. On other occasions, insufficient ligand modifying reagent may be added, in which case the bound ligand compound may not be adequately modified to bestow aqueous compatibility to the nanoparticles.

Modification of the solubilising group precursor ligand compound before contacting with the nanoparticles in accordance with embodiments of the present invention has the advantage of allowing the ligand modifying reagent to be added to the solubilising group precursor ligand in an appropriate stoichiometric amount relative to the amount of ligand, thereby avoiding adding too much or too little. Thus, not only is the material of the nanoparticles protected from potentially deleterious exposure to the ligand modifying agent, but the resulting nanoparticles can be purified and analysed using conventional solution phase analytical techniques.

In some embodiments, the core of the quantum dot includes a semiconductor material. The semiconductor material may incorporate ions from any one or more of groups 2 to 16 of the periodic table, including binary, ternary and quaternary materials, that is, materials incorporating two, three or four different ions respectively. By way of example, nanoparticles that may be rendered aqueous compatible using the method according to the first aspect of the present invention may incorporate a core semiconductor material, such as, but not limited to, CdS, CdSe, CdTe, ZnS, ZnSe, ZnTe, InP, InAs, InSb, AlP, AlS, AlAs, AlSb, GaN, GaP, GaAs, GaSb, PbS, PbSe, Si, Ge and combinations thereof. Nanoparticles according to some embodiments of the present invention preferably possess cores with mean diameters of less than around 20 nm, more preferably less than around 15 nm and most preferably in the range of around 2 to 5 nm.

Quantum dot nanoparticles that comprise a single semiconductor material, e.g., CdS, CdSe, ZnS, ZnSe, InP, GaN, etc, typically have relatively low quantum efficiencies arising from non-radiative electron-hole recombinations that occur at defects and dangling bonds at the surface of the nanoparticles. In order to at least partially address these issues, the nanoparticle cores may be at least partially coated with one or more layers (also referred to herein as "shells") of a material different from that of the core, for example a semiconductor material. The material comprised in the or each shell may incorporate ions from any one or more of groups 2 to 16 of the periodic table. Where a nanoparticle includes two or more shells, each shell is preferably formed of a different material. In an exemplary core/shell material, the core is formed of one of the materials specified above and the shell is comprised of a semiconductor material of larger band-gap energy and similar lattice dimensions to the core material. Exemplary shell materials include, but are not limited to, ZnS, MgS, MgSe, MgTe and GaN. The confinement of charge carriers within the core and away from surface states provides quantum dots of greater stability and higher quantum yield.

The mean diameter of quantum dot nanoparticles that may be rendered aqueous compatible using the methodology of embodiments of the present invention, may be varied to modify the emission-wavelength. The energy levels and hence the frequency of the quantum dot fluorescence emission may be controlled by the material from which the quantum dot is made and the size of the quantum dot. Generally, quantum dots made of the same material have a more pronounced red emission the larger the quantum dot. It is preferred that the quantum dots have diameters of around 1 to 15 nm, more preferably around 1 to 10 nm. The quantum dots preferably emit light having a wavelength of around 400 to 900 nm, more preferably around 400 to 700 nm.

Typically, as a result of the core and/or shelling procedures employed to produce the core, core/shell or core/multishell nanoparticles, the nanoparticles may be at least partially coated with a surface binding ligand, such as myristic acid, hexadecylamine and/or trioctylphosphineoxide. Such ligands are typically derived from the solvent in which the core and/or shelling procedures were carried out. While ligands of this type may increase the stability of the nanoparticles in non-polar media, provide electronic stabilisation and/or negate undesirable nanoparticle agglomeration, as mentioned previously, such ligands tend to prevent the nanoparticles from stably dispersing or dissolving in more polar media, such as aqueous solvents.

In preferred embodiments, the present invention provides quantum dots that are aqueous compatible, stable, small and of high quantum yield. Where lipophilic surface binding ligand(s) are coordinated to the surface of the quantum dots as a result of the core and/or shelling procedures (examples include hexadecylamine, trioctylphosphineoxide, myristic acid), such ligands may be exchanged entirely or partially with the ligand incorporating the pre-modified, or "activated", solubilising group, or the pre-modified ligand may interchelate with the existing lipophilic surface binding ligands.

As set out above in respect of the first aspect of the present invention, prior to modifying or activating the solubilising ligand, the ligand incorporates a solubilising group precursor as well as a nanoparticle binding group. It is preferred that the solubilising group precursor contains an ionisable group, that is, a chemical group that can be ionised by treatment with a suitable agent (e.g., an ionising agent). It will be appreciated that converting the ionisable precursor group to an ionised group increases the ability of that group to at least partially solubilise the nanoparticle to which the ligand will be bound in polar media, such as aqueous solvents.

The solubilising group precursor may be any desirable type of chemical group, provided it can be converted to a solubilising group of increased solubilising ability in comparison to the precursor group. In this way, converting the precursor group to the solubilising group before contacting the nanoparticles with the ligand containing the solubilising group helps avoid the need to treat the ligands when bound to the surface of the nanoparticles to render the nanoparticles aqueous compatible. Embodiments of the method of the present invention therefore provide a way to increase the aqueous compatibility of nanoparticles whilst avoiding or reducing detriment to the desired physical, chemical and/or optical properties of the nanoparticles that may occur when using prior art post-binding surface treatment procedures to render the nanoparticles aqueous compatible.

Taking into account the above requirements, any suitable solubilising group precursor may be incorporated into the nanoparticle binding ligand according to embodiments of the present invention. In preferred embodiments, the precursor may be an organic group and/or may contain one or more heteroatoms (i.e., non-carbon atoms), such as sulfur, nitrogen, oxygen and/or phosphorus. Exemplary precursor groups include hydroxide, alkoxide, carboxylic acid, carboxylate ester, amine, nitro, polyethyleneglycol, sulfonic acid, sulfonate ester, phosphoric acid and phosphate ester.

In a preferred embodiment, the solubilising ligand may be represented by Formula 1.

  Formula 1 where X is a functional group that can bind to a nanoparticle with or without further modification (examples include $-SR^1$ ($R^1$=H, alkyl, aryl), $-OR^2$ ($R^2$=H, alkyl, aryl), $-NR^3R^4$ ($R^3$ and/or $R^4$=H, alkyl, aryl), $-CO_2R^5$ ($R^5$=H, alkyl, aryl), $-P(=O)OR^6OR^7$ ($R^6$ and/or $R^7$=H, alkyl, aryl).);

Y is a single bond or an alkyl, aryl, heterocyclic, polyethyleneglycol, a functionalised alkyl, aryl, heterocyclic, polyethyleneglycol, (examples of functional groups include halogen, ether, amine, amide, ester, nitrile, isonitrile, aldehyde, carbonate, ketone, alcohol, carboxylic acid, azide, imine, enamine, anhydride, acid chloride, alkyne, thiol, sulfide, sulfone, sulfoxide, phosphine, phosphine oxide) any linker (e.g., a carbon, nitrogen, oxygen or sulfur atom; a substituted or unsubstituted, saturated or unsaturated aliphatic or alicyclic group;

a substituted or unsubstituted aromatic group; or one or more ethylene oxide repeating units), or a crosslinkable/polymerisable group (examples include carboxylic acid, amine, vinyl, alkoxysilane, epoxide); and Z is a solubilising group precursor that may be selected from the group of $-OR^8$ where $R^8$ is hydrogen or an alkyl group that may be substituted or unsubstituted, and/or saturated or unsaturated; $-C(O)OR^9$ where $R^9$ is hydrogen, a substituted or unsubstituted, saturated or unsaturated aliphatic or alicyclic group, or a substituted or unsubstituted aromatic group; $-NR^{10}R^{11}$ where $R^{10}$ and $R^{11}$ are independently hydrogen, a substituted or unsubstituted, saturated or unsaturated aliphatic or alicyclic group, or a substituted or unsubstituted aromatic group, or $R^{10}$ and $R^{11}$ may be linked such that $-NR^{10}R^{11}$ forms a nitrogen-containing heterocyclic ring of any desirable size, e.g., a five-, six- or seven-membered ring; $-N^+R^{12}R^{13}R^{14}$ where $R^{12}$, $R^{13}$ and $R^{14}$ are independently hydrogen, a substituted or unsubstituted, saturated or unsaturated aliphatic or alicyclic group, or a substituted or unsubstituted aromatic group; $-NO_2$; $-(OCH_2CH_2)_nOR^{15}$ where $R^{15}$ is hydrogen, a substituted or unsubstituted, saturated or unsaturated aliphatic or alicyclic group, or a substituted or unsubstituted aromatic group; $-S(O)_2OR^{16}$ where $R^{16}$ is hydrogen, a substituted or unsubstituted, saturated or unsaturated aliphatic or alicyclic group, or a substituted or unsubstituted aromatic group; and $-P(OR^{17})(OR^{18})O$ where $R^{17}$ and $R^{18}$ are independently hydrogen, a substituted or unsubstituted, saturated or unsaturated aliphatic or alicyclic group, or a substituted or unsubstituted aromatic group.

As mentioned above, conversion of the solubilising group precursor in the nanoparticle binding ligand to the solubilising group is intended to increase the ability of the ligand to solubilise the nanoparticles to which it will ultimately become bound. The solubilising group generated from the solubilising group precursor therefore possesses higher nanoparticle solubilising ability than the precursor. While any appropriate solubilising group may be employed taking into account the above requirements, in a preferred embodiment the solubilising group is a charged or polar group, such as a hydroxide salt, alkoxide salt, carboxylate salt, ammonium salt, sulfonate salt or phosphate salt.

The pre-modified or activated nanoparticle binding ligand with which nanoparticles may be contacted to increase their aqueous compatibility may be represented by the structure shown in Formula 2.

  Formula 2 where X and Y are as defined above with respect to Formula 1, and Z' is a solubilising group, i.e., a group that can confer aqueous solubility to a nanoparticle to which the ligand, X—Y—Z', is bound. Preferably Z' is a charged or polar group, such as, but not limited to, a hydroxide salt, alkoxide salt, carboxylate salt, ammonium salt, sulfonate salt, phosphate salt and the like.

Step a of the method forming the first aspect of the present invention thus involves converting the solubilising group precursor, Z, to the solubilising group, Z', using a suitable modifying agent as follows:

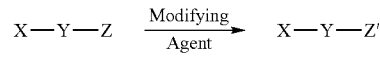

Any desirable modifying agent may be used provided it effects appropriate conversion of the solubilising group precursor to the solubilising group. In a preferred embodiment, conversion of the solubilising group precursor is effected by treating the precursor with an ionizing agent, that is, the modifying agent is an agent that ionises the solubilising group precursor to generate an ionised solubilising group.

The modifying agent may be a Lewis acid compound (i.e., an electron pair acceptor) or a Lewis base compound (i.e., an electron pair donor). Preferably conversion of the solubilising group precursor is effected by treating the precursor with an organic base, such as an ammonium salt or an alkoxide salt. The ammonium salt may be an alkylammonium salt, such as tetramethylammonium hydroxide, tetraethylammonium hydroxide or tetrabutylammonium hydroxide. An exemplary alkoxide salt is a metal alkoxide salt, such as lithium tert-butoxide, sodium tert-butoxide or potassium tertbutoxide.

In an exemplary embodiment, the solubilising group precursor may be a sulfonic acid group, which can be treated with an organic base, such as an alkylammonium salt, to generate a sulfonate salt solubilising group.

Conversion of the solubilising group precursor to the solubilising group is at least partially effected before the nanoparticle binding ligand is exposed to the nanoparticle to be treated to increase the nanoparticle's aqueous compatibility. While the solubilising group precursor conversion and nanoparticle treatment may be effected in the same reaction media or solvent, it is preferred that conversion of the solubilising group precursor is carried out in a first reaction media or solvent and the treatment of the nanoparticles with the nanoparticle binding ligand incorporating the solubilising group is effected in a separate second reaction media or solvent.

In preferred embodiments of the present invention, the pre-modified or activated nanoparticle binding ligand defined above in Formula 2 (X—Y—Z'), may have the preferred structure shown in Formula 3.

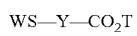
WS—Y—CO$_2$T      Formula 3 where Y is as defined above with respect to Formulae 1 and 2, and W and T are chemical groups or atoms suitable to coordinate the sulfur atom and carboxyl oxygen atoms respectively.

Depending upon the nature of the conversion reaction employed to convert the original solubilising group precursor (Z) to the solubilising group (Z' in Formula 2, —CO$_2$T in Formula 3), W may be a hydrogen atom if, for example, the precursor was treated with one equivalent of base (Formula 3=HS—Y—CO$_2$T), or, if the precursor was treated with two or more equivalents of base, W may be derived from the base used for the conversion reaction. By way of example, W may be an ammonium cation (e.g., $^+$N(R$^{19}$)$_4$ where each R$^{19}$ is separately selected from the group consisting of a hydrogen atom, a substituted or unsubstituted, saturated or unsaturated aliphatic group; a substituted or unsubstituted, saturated or unsaturated alicyclic group; and a substituted or unsubstituted aromatic group). In preferred embodiments, each R$^{11}$ may be an alkyl group (e.g., methyl, ethyl, propyl, butyl etc), a carbocyclic group (e.g., an aryl group), or a heterocyclic group (e.g., a heteroaryl group). In further preferred embodiments, W may be a metal ion, such as, but not limited to, sodium, potassium, or lithium.

In Formula 3, T may be derived from the base used for converting the solubilising group precursor (Z) to the solubilising group (Z'). By way of example, T may be an ammonium cation (e.g., $^+$N(R$^{20}$)$_4$ where each R$^{20}$ is separately selected from the group consisting of a hydrogen atom, a substituted or unsubstituted, saturated or unsaturated aliphatic group; a substituted or unsubstituted, saturated or unsaturated alicyclic group; and a substituted or unsubstituted aromatic group). Each R$^{20}$ may be an alkyl group (e.g., methyl, ethyl, propyl, butyl etc), a carbocyclic group (e.g., an aryl group), or a heterocyclic group (e.g., a heteroaryl group). In further preferred embodiments, T may be a metal ion, such as, but not limited to, sodium, potassium, or lithium.

It will be appreciated from the foregoing that under certain circumstances, W and T may represent the same type of chemical group that may, for example, be derived from the base used to convert the solubilising group precursor (Z) to the solubilising group (Z'). In the case where two or more equivalents of a base, such as tetrabutylammonium hydroxide, are used for the conversion reaction (Z to Z'), both W and T may be tetrabutylammonium cations.

The propensity of sulfur to donate electrons into the vacant orbital(s) of a metal will promote coordination of the preferred ligand compound (WS—Y—CO$_2$T) in Formula 3 to the metal atoms/ions (examples include Zn, Cd, Zn$^{2+}$, Cd$^{2+}$) at the nanoparticle surface via the sulfur atoms, while the terminal carboxylate group will be solvated by surrounding polar molecules (e.g., water molecules) to render the nanoparticle aqueous compatible.

In a particularly preferred embodiment, exemplified below, the pre-modified ligand is a salt of a mercaptocarboxylic acid, cysteine (further examples include, but are not limited to, mercaptopropanoic acid, mercaptohexanoic acid and mercaptooctanoic acid), in which the acid has been treated with two equivalents of a base, tetrabutylammonium hydroxide, to deprotonate both the carboxylic acid group and the thiol group. It will be appreciated that one equivalent of base may be used, in which case the functional group with the lowest pKa deprotonates preferentially. In the case of cysteine, the carboxylic acid group has a pK$_a$ of around 2 and the thiol group has a pK$_a$ of around 8 and so the carboxylic acid group deprotonates before the thiol group.

The pre-formed carboxylate group of the mercaptocarboxylate salt is solvated by water molecules which imparts the aqueous compatibility to the coated quantum dots. Pre-forming the carboxylate salt avoids the need to deprotonate the carboxylic acid functionality by addition of a base post-ligand exchange, that, as mentioned previously, is often detrimental to the quantum yield of the final quantum dot.

The carboxylate group may also provide appropriate chemical functionality to participate in coupling/crosslinking reaction(s), such as the carbodiimide mediated coupling between a carboxylic acid and an amine, or to be coupled to other species including proteins, peptides, antibodies, carbohydrates, glycolipids, glycoproteins and/or nucleic acids.

In addition, any pendant functional group(s) of the mercaptocarboxylic acid (e.g., the amine group of cysteine) may participate in coupling/crosslinking reaction(s), for example the carbodiimide-mediated coupling between a carboxylic acid and amine and the crosslinking of an amine with bis [sulfosuccinimidyl] suberate, or to couple with other species of the kind mentioned above in respect of the carboxylate group, e.g., proteins, peptides etc.

In the preferred embodiment where two equivalents of base have been used, pre-forming the thiolate group of the mercaptocarboxylate salt may facilitate coordination of the ligand compound to the surface of the quantum dot. The sulfur atom of the thiolate group may chelate to the metal atoms/ions (examples include Zn, Cd, Zn$^{2+}$, Cd$^{2+}$) at the surface of the quantum dot, while the cation derived from the base (examples include $^+$NMe$_4$, $^+$NBu$_4$), which was initially associated with thiolate group, complexes with the counter atoms/ions (examples include S, Se, S$^{2-}$, Se$^{2-}$) at the surface of the quantum dot. Such complexation may provide the advantage of passivating the surface of the quantum dot.

In preferred embodiments the ligand incorporating the solubilising group precursor is a mercaptocarboxylic acid. The mercaptocarboxylic acid may incorporate one or more ethylene oxide repeating units and/or optionally incorporates an amine or amide functional group. A particularly preferred solubilising group precursor has the formula

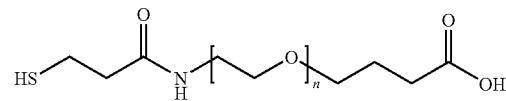

where n is an integer up to around 2000, more preferably up to around 1000 and still more preferably up to around 100. It is particularly preferred that n is in the range around 1 to around 2000, more preferably around 10 to around 500, and yet more preferably around 20 to around 100. In a preferred embodiment, and as employed in Examples 2 and 3 described below, n is around 80.

In alternative embodiments, the nanoparticle binding group, X in Formula 1 and 2 may be a multidentate group, i.e., a chemical group incorporating two or more atoms that can form a binding interaction, such as a dative bond, with atoms/ions of the nanoparticle. Additionally or alternatively, the solubilising group, Z' in Formula 2 may be a multidentate group incorporating two or more atoms that can interact with the surrounding solvent.

The or each multidentate group may incorporate one or more atoms, such as sulfur, oxygen, nitrogen or phosphorous atoms, and/or one or more groups such as —$SR^{21}$ ($R^{21}$=H, alkyl, aryl), —$OR^{22}$ ($R^{22}$=H, alkyl, aryl), —$NR^{23}R^{24}$ ($R^{23}$ and/or $R^{24}$=H, alkyl, aryl), —$CO_2R^{25}$ ($R^{25}$=H, alkyl, aryl), —P(=O)$OR^{26}OR^{27}$ ($R^{26}$ and/or $R^{27}$=H, alkyl, aryl). Particularly preferred multidentate groups include thiol (—SH), hydroxyl (—OH), carboxyl (—$CO_2$H) and phosphonyl groups (—P(=O)(OH)$_2$).

Examplary multidentate groups include but are note limited to those shown in FIG. 1 in which: A is a functional group, such as $SR^{21}$, —$OR^{22}$, —$NR^{23}R^{24}$, —$CO_2R^{25}$, —P(=O)$OR^{26}OR^{27}$ as defined above; B is a first suitable linking group, such as NH, O, $CH_2$; and D is a second suitable linking group, such as N, CH, C etc.

Further examples of suitable multidentate groups may incorporate any one or more of the following groups/atoms which may bind to a nanoparticle: functional groups such as ether, amine, amide, ester, nitrile, isonitrile, aldehyde, carbonate, ketone, alcohol, carboxylic acid, azide, imine, enamine, anhydride, acid chloride, alkyne, thiol, sulfide, epoxide, sulfone, sulfoxide, phosphine, phosphine oxide, vinyl and/or alkoxysilane; heterocyclic groups incorporating one or more non-carbon atom; and/or halogen atoms.

The method of the present invention may be used to render nanoparticles, particularly but not exclusively semiconductor quantum dots, aqueous compatible by partial or substantially complete substitution of any surface bound lipophilic ligand molecules with a pre-modified ligand compound which has been "activated" to afford aqueous compatibility prior to binding to the nanoparticle surface. Alternatively or additionally the pre-modified ligand may interchelate existing ligands bound to the nanoparticle surface. It will be understood that nanoparticles treated with the ligand compound according to the present invention may have surface ligands that differ not only according to the nature of the nanoparticle binding group (e.g., X in Formulae 1 and 2, or WS in Formula 3), linking group—if present, (e.g. Y in Formulae 1, 2 and 3), and/or solubilising group (e.g., Z' in Formula 2, or $CO_2$T in Formula 3), but that there may be regions of the surface of the nanoparticle to which no ligands are bound and/or regions to which ligands (e.g. lipophilic ligands) remain bound from the original nanoparticle synthesis procedure.

As discussed above, in embodiments of the method of the present invention, the solubilising group precursor is converted to the solubilising group before it is bound to the nanoparticle surface. This therefore avoids or reduces the need for post-binding surface treatment procedures, which can often result in too much or too little ligand modifying agent being added. Embodiments of the present invention thus facilitate accurate control of the amount of the ligand modifying agent added. As a result, it may be possible to ensure that a sufficient amount of the ligand modifying agent is added to produce the desired quantity of solubilising agent, while also ensuring that the material of the nanoparticles is protected from potentially harmful exposure to the ligand modifying agent. Moreover, the resulting nanoparticles with pre-formed solubilising groups attached can be purified and analysed using conventional solution phase analytical techniques.

Quantum dots derivatised with a ligand molecule of embodiments of this invention preferably have a quantum yield at least equal to, and more preferably greater than, the quantum yield of the quantum dot sample before ligand exchange. In addition, these aqueous compatible quantum dots have enhanced stability compared with the parent quantum dot sample when irradiated with uv-light (365 nm) aerobically.

It will be appreciated that the scope of the present invention is not limited to the preferred embodiments described above and that the embodiments may be modified without departing from the basic concept underlying each aspect of the present invention defined above.

EXAMPLES

Example 1

1.1 Preparation of CdSe/CdZnS/ZnS/HDA-TOPO Nanoparticles

| Material | Amount | Moles | MW | Grade |
|---|---|---|---|---|
| Synthesis of CdSe cores | | | | |
| Capping agent | | | | |
| HDA | 50 g | 0.21 | 241.46 | 90% |
| Reagents | | | | |
| [Et$_3$NH]$_4$Cd$_{10}$Se$_4$(SPh)$_{16}$ | 1 gram (g) | 3.034 × 10$^{-3}$ | 3295.44 | |
| TOP/Se (0.5M) | 4 milliliter (ml) | 2 × 10$^{-3}$ | 78.96 | |
| TOP/Se (0.2M) | 12 ml | 2.4 × 10$^{-3}$ | 78.96 | |
| CdO | 1.284 g | 0.01 | 128.41 | 99% |
| Oleic Acid | 19.1 ml | 0.059 | 282.46 | 90% |
| ODE | 30.9 ml | 0.096 | 252.48 | 90% |
| Solvents | | | | |
| Methanol | 80 ml | | | Anhydrous |
| Chloroform | 10 ml | | | Anhydrous |

In one embodiment, the quantum dot nanoparticles were synthesised by loading hexadecylamine (50 g, 0.21 moles) into a 250 ml three-neck round bottomed flask, equipped with a condenser and a thermometer. The hexadecylamine was degassed under vacuum (110° C., 1 hour).

The hexadecylamine was then cooled (90° C.) and CdSe cluster ([Et$_3$NH]$_4$Cd$_{10}$Se$_4$(SPh)$_{16}$, 0.25 g, moles) and trioctylphosphine/Se (0.5 M, 3 ml) were added. Once the solid had dissolved the temperature was increased (160° C.) and the solution left stirring under N$_{2(g)}$ (30 mins). PL$_{max}$=495 nm.

The temperature was increased (170° C.) and the Cd precursor (1 ml) and trioctylphosphine/Se (0.2 M, 1 ml) were mixed together and added drop-wise slowly to the reaction mixture and stirred (30 mins). PL$_{max}$=513 nm. The solution was then cooled (120° C.) and annealed overnight.

The temperature was increased (180° C.) and a mixture of Cd precursor solution (2 ml) and trioctylphosphine/Se (0.2 M, 2 ml) was added dropwise slowly to the reaction mixture and then stirred (30 mins). PL$_{max}$=528 nm.

The temperature was increased (190° C.) and a mixture of the Cd precursor (2 ml) and trioctylphosphine/Se (0.2 M, 2 ml) was added drop-wise slowly to the reaction mixture and stirred (30 mins) PL$_{max}$=540 nm.

The temperature was increased (200° C.) and a mixture of Cd precursor solution (2 ml) and trioctylphosphine/Se (0.2 M, 2 ml) added drop-wise slowly to the reaction mixture and stirred (1 hr 30 mins) PL$_{max}$=560 nm.

The reaction mixture was cooled (120° C.) and annealed overnight. The reaction mixture was cooled further (50° C.) and anhydrous methanol (80 ml) added to precipitate the nanoparticles that were isolated by centrifugation and dissolved in anhydrous chloroform (10 ml).

| Shelling of CdSe Cores with CdZnS | | | | |
|---|---|---|---|---|
| Material | Amount | Moles | MW | Grade |
| Capping agent | | | | |
| HDA | 20 g | | 241.46 | 90% |
| TOPO | | | | |
| Reagents | | | | |
| Cd(Ac)$_2$•2H$_2$O | 0.68 g | 2.55 × 10$^{-3}$ | 266.52 | |
| Zn(Ac)$_2$ | 0.46 g | 2.55 × 10$^{-3}$ | 183.46 | |
| ODE | 41 ml | | 252.48 | 90% |
| Oleic Acid | 9 ml | 0.036 | 282.46 | 90% |
| S/ODE (0.1M) | 6 ml | 6 × 10$^{-3}$ | 32.065 | |
| Solvents | | | | |
| Methanol | 70 ml + 40 ml | | | Anhydrous |
| Chloroform | 10 ml | | | Anhydrous |

20 g HDA and 15 g TOPO was loaded into a 250 ml three-neck round bottomed flask, equipped with a condenser and a thermometer. The HDA/TOPO was degassed under vacuum at 110° C. for 1 hour.

The HDA/TOPO was then cooled to 90° C. and CdSe cores (in 10 ml chloroform) were added. The chloroform was removed under vacuum.

The temperature was increased to 210° C. and 2 ml of the CdZn (0.1 M) precursor solution and S/ODE was added slowly drop-wise and then the solution was left stirring for 10 mins.

This was repeated twice more (a total of 6 ml each of CdZn precursor and S/ODE added) and then the solution was left annealing at 210° C. for 30 mins.

The solution was then cooled to 50° C., anhydrous methanol (70 ml) was added and isolated the solid using centrifugation. The solid was then washed with anhydrous methanol (40 ml). The solid was re-dissolved in anhydrous chloroform (10 ml). PL$_{max}$=596 nm.

| Shelling of CdSe/CdZnS with ZnS | | | | |
|---|---|---|---|---|
| Material | Amount | Moles | MW | Grade |
| Capping agent | | | | |
| HDA | 20 g | | 241.46 | 90% |
| TOPO | 40 g | | | |
| Reagents | | | | |
| ZnEt$_2$/TOP (0.25 M) | 8 ml | | 266.53 | |
| (TMS)$_2$S/TOP (0.25 M) | 8 ml | | 183.46 | |
| Solvents | | | | |
| Methanol | 20 ml | | | Anhydrous |
| Isopropanol | 60 ml + 40 ml | | | Anhydrous |
| Toluene | 10 ml | | | Anhydrous |

20 g HDA and 40 g TOPO was loaded into a 250 ml three-neck round bottomed flask, equipped with a condenser and a thermometer. The HDA/TOPO was degassed under vacuum at 110° C. for 1 hour.

The HDA/TOPO was then cooled to 90° C. and the CdSe/CdZnS cores (in 10 ml chloroform) added. The chloroform was removed under vacuum.

The solution was then heated to 190° C. and ZnEt$_2$/TOP (0.25 M) and (TMS)$_2$_S/TOP (0.25 M) were added in alternate 0.5 ml portions starting with ZnEt$_2$, until 8 ml of each solution had been added, leaving at least 10 mins between each addition.

The solution was then cooled to 120° C. and left annealing for 1 hr. The solution was then cooled to 50° C., anhydrous methanol (20 ml) and anhydrous isopropanol (60 ml) added, and the solid isolated using centrifugation. The solid was then washed with anhydrous isopropanol (40 ml) and dissolved in anhydrous toluene (15 ml).

Preparation of Coring and Shelling Solutions

Cadmium Precursor Solution (0.2 M)

Loaded 1.284 g CdO, 19.1 ml Oleic acid and 30.9 ml ODE into a three-neck round bottomed flask and heated to 250° C. under N$_2$. Maintained the temperature until solution went colourless (~20 mins) and then cooled ready for use. (Solution was kept warm with very gentle heating and stirring as it solidifies at room temperature)

CdZn Precursor Solution "Shelling solution" (0.08 M)

Loaded 0.68 g Cd(Ac)$_2$.2H20, 0.46 g Zn(Ac)$_2$, 41 ml ODE and 9 ml Oleic acid into a round bottomed flask and heated gently under vacuum until all of the solid dissolved.

Solution was kept warm with very gentle heating and stirring for use, as it solidifies at room temperature.

1.2 Preparation of Aqueous Compatible CdSe/CdZnS/ZnS Quantum Dots

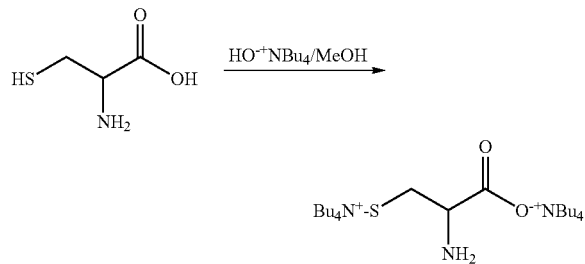

A QD surface binding ligand molecule was synthesised by addition of an aliquot of tetrabutylammonium hydroxide methanol solution (1 M, 1642.7 μl, 1.642792 mmol) to cysteine (0.1026 g, 0.821396 mmol) and homogenised to provide the corresponding salt ($Bu_4N^{+-}SCH_2CH(NH_2)CO_2^{-+}NBu^4$, 0.0005 mmol/μl).

An aliquot of the ligand molecule ($Bu^4N^{+-}SCH_2CH(NH_2)CO_2^{-+}NBu_4$) (0.001-0.2 mmol) was added to the CdSe/CdZnS/ZnS/HDA-TOPO quantum dots (125 nmol) (prepared as described above; quantum yield=49%, $\lambda_{max}^{em}$=620 nm, FWHM=31 nm) in chloroform to give a solution with a total volume of 1000 μl. The reaction mixture was homogenised and then incubated (4 hours). The quantum dots precipitated from the reaction mixture, which was subsequently centrifuged (10,000 RPM, 5 mins). The supernatant was separated from the pellet, which was dispersed in water (400 μl) to give a clear solution (quantum yield=40%). The sample was then annealed by irradiation (39 hours) with uv-light (365 nm) (quantum yield=55%).

It can be observed from the results presented above that the quantum yield of the quantum dots fell by only 9% from 49% to 40% after binding of the preformed solubilising ligand ($Bu_4N^{+-}SCH_2CH(NH_2)CO_2^{-+}NBu_4$). This equates to a reduction in quantum yield of only around 18%, compared to a reduction of around 50% to 100% which is typically observed after modifying quantum dots using prior art post-ligand binding surface treatment methods.

Example 2

Preparation of Aqueous Compatible InP/ZnS/ZnO Quantum Dots

Preparation of Surface Binding Ligand

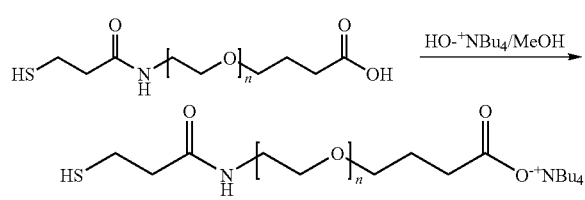

A QD surface binding ligand molecule was synthesised by addition of an aliquot of a solution of tetrabutylammonium hydroxide in methanol (1 M, 14 μl, 0.014 mmol) to a solution of HS—$C_2H_4$—CONH—(PEG)$_{-80}$—$C_3H_6$—$CO_2H$ (MWt=3711, 0.0522 g, 0.014 mmol) in methanol (986 μl) and homogenised to provide the corresponding salt HS—$C_2H_4$—CONH—(PEG)$_{-80}$—$C_3H_6$—$CO_2^{-+}NBu_4$ (0.000014 mmol/μl).

Ligand Binding

An aliquot of the ligand molecule HS—$C_2H_4$—CONH—(PEG)$_{-80}$—$C_3H_6$—$CO_2^{-+}NBu_4$ (269.4 μl, 0.00377 mmol) was added to InP/ZnS/ZnO quantum dots (4 mg; PL=612 nm; quantum yield=50%; FWHM=95 nm; TGA=78% in organic material) in chloroform to give a solution with a total volume of 4000 μl. The reaction mixture was homogenised and incubated (4 hours).

The reaction mixture was concentrated under reduced pressure and then dissolved in water (1000 μl) and filtered through a PTFE syringe filter (0.2 μm) to provide a homogenous transparent red coloured solution (quantum yield=21%; emission spectrum shown in FIG. 8). FIGS. 10A and 10B are photographs of HS—$C_2H_4$—CONH—(PEG)$_{-80}$—$C_3H_6$—$CO_2^{-+}NBu_4$ modified quantum dots in water irradiated with ambient light (FIG. 10A) and 365 nm light (FIG. 10B).

Example 3

Preparation of Aqueous Compatible InP/ZnS/ZnO Quantum Dots

Preparation of Surface Binding Ligand

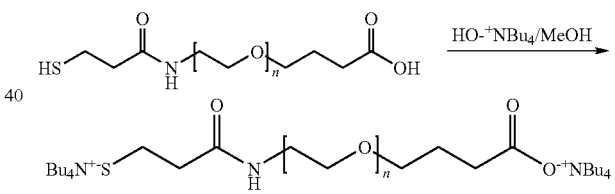

A QD surface binding ligand molecule was synthesised by addition of an aliquot of a solution of tetrabutylammonium hydroxide in methanol (1 M, 26.8 μl, 0.0268 mmol) to a solution of HS—$C_2H_4$—CONH—(PEG)_80—$C_3H_6$—$CO_2H$ (MWt=3711, 0.0499 g, 0.0134 mmol) in methanol (973.2 μl) and homogenised to provide the corresponding salt $Bu_4N^{+-}S$—$C_2H_4$—CONH—(PEG)$_{-80}$—$C_3H_6$—$CO_2^{-+}NBu_4$ (0.0000134 mmol/μl).

Ligand Binding

An aliquot of the resultant ligand molecule $Bu_4N^{+-}S$—$C_2H_4$—CONH—(PEG)$_{-80}$—$C_3H_6$—$CO_2^{-+}NBu_4$ (281.3 μl, 0.00377 mmol) was added to InP/ZnS/ZnO quantum dots (4 mg; PL=612 nm; quantum yield=50%; FWHM=95 nm; TGA=78% in organic material) in chloroform to give a solution with a total volume of 4000 μl. The reaction mixture was homogenised and incubated (4 hours).

The reaction mixture was concentrated under reduced pressure and then dissolved in water (1000 μl) to provide a homogenous transparent red coloured solution (quantum yield=19%; emission spectrum shown in FIG. 9).

It will be seen that the techniques described herein provide a basis for improved production of nanoparticle materials. The terms and expressions employed herein are used as terms of description and not of limitation, and there is no intention in the use of such terms of and expressions of excluding any equivalents of the features shown and described or portions thereof. Instead, it is recognized that various modifications are possible within the scope of the invention claimed.

What is claimed is:

1. A method for producing aqueous compatible nanoparticles using a binding ligand incorporating a nanoparticle binding group and a solubilising group precursor, the method comprising:
   a. converting the solubilising group precursor to a solubilising group, and
   b. contacting nanoparticles with said binding ligand incorporating said solubilising group so as to effect binding of said binding ligand to said nanoparticles and thereby produce said aqueous compatible nanoparticles, wherein
   said ligand is a mercaptocarboxylic acid incorporating one or more ethylene oxide repeating units.

2. A method according to claim 1, wherein said conversion of the solubilising group precursor is effected by contacting the nanoparticle binding ligand with a sufficient amount of a precursor modifying agent to convert the solubilising group precursors present in said binding ligand to solubilising groups.

3. A method according to claim 1, wherein said conversion of the solubilising group precursor is effected by contacting the nanoparticle binding ligand with an approximately stoichiometric amount of a precursor modifying agent based on the amount of solubilising group precursor present in said binding ligand.

4. A method according to claim 1, wherein said conversion of the solubilising group precursor is effected by treating said precursor with an ionizing agent.

5. A method according to claim 1, wherein said conversion of the solubilising group precursor is effected by treating said precursor with at least one of a Lewis acid or a Lewis base compound.

6. A method according to claim 1, wherein said conversion of the solubilising group precursor is effected by treating the precursor with an organic base.

7. A method according to claim 1, wherein said conversion of the solubilising group precursor is effected in a first solvent and said contacting of the nanoparticles with the nanoparticle binding ligand incorporating said solubilising group is effected in a separate second solvent.

8. A method according to claim 1, wherein the solubilising group precursor comprises an ionisable group.

9. A method according to claim 1, wherein said binding group and said solubilising group are connected via a linker.

10. A method according to claim 9, wherein said linker incorporates up to around 2000 ethylene oxide repeating units.

11. A method according to claim 10, wherein said linker incorporates around 20 to around 100 ethylene oxide repeating units.

12. A method according to claim 1, wherein said mercaptocarboxylic acid incorporates a functional group selected from the group consisting of an amine group and an amide group.

13. A method according to claim 1, wherein said nanoparticles contacted by the binding ligand are semiconductor nanoparticles.

14. A method according to claim 1, wherein said nanoparticles contacted by the binding ligand are core, core/shell or core/multishell nanoparticles.

15. A method according to claim 1, wherein said nanoparticles contacted by the binding ligand comprise one or more semiconductor materials selected from the group consisting of CdS, CdSe, CdTe, ZnS, ZnSe, ZnTe, InP, InAs, InSb, AlP, AlS, AlAs, AlSb, GaN, GaP, GaAs, GaSb, PbS, PbSe, Si, Ge, MgS, MgSe, MgTe, and combinations thereof.

16. A method for producing aqueous compatible nanoparticles using a nanoparticle binding ligand incorporating a binding group and a solubilising group precursor, the method comprising:
   a. converting the solubilising group precursor to a solubilising group, and
   b. contacting nanoparticles with said binding ligand incorporating said solubilising group so as to effect binding of said binding ligand to said nanoparticles and thereby produce said aqueous compatible nanoparticles,
   wherein said ligand is a mercaptocarboxylic acid incorporating one or more ethylene oxide repeating units and/or a functional group selected from the group consisting of an amine group and an amide group.

* * * * *